(12) United States Patent
Wikstroem et al.

(10) Patent No.: US 11,967,638 B2
(45) Date of Patent: Apr. 23, 2024

(54) SEGMENTED POWER DIODE STRUCTURE WITH IMPROVED REVERSE RECOVERY

(71) Applicant: Hitachi Energy Ltd, Zürich (CH)

(72) Inventors: Tobias Wikstroem, Egliswil (CH); Umamaheswara Vemulapati, Windisch (CH); Thomas Stiasny, Wädenswil (CH)

(73) Assignee: Hitachi Energy Ltd, Zurich (CH)

( * ) Notice: Subject to any disclaimer, the term of this patent is extended or adjusted under 35 U.S.C. 154(b) by 85 days.

(21) Appl. No.: 17/600,812

(22) PCT Filed: Apr. 1, 2020

(86) PCT No.: PCT/EP2020/059271
§ 371 (c)(1),
(2) Date: Oct. 1, 2021

(87) PCT Pub. No.: WO2020/201361
PCT Pub. Date: Oct. 8, 2020

(65) Prior Publication Data
US 2022/0181473 A1    Jun. 9, 2022

(30) Foreign Application Priority Data

Apr. 2, 2019 (EP) ..................................... 19166711

(51) Int. Cl.
*H01L 29/74* (2006.01)
*H01L 29/66* (2006.01)
*H01L 29/745* (2006.01)

(52) U.S. Cl.
CPC .... *H01L 29/7416* (2013.01); *H01L 29/66371* (2013.01); *H01L 29/7455* (2013.01)

(58) Field of Classification Search
CPC ........... H01L 29/7416; H01L 29/66371; H01L 29/66113; H01L 29/66106;
(Continued)

(56) References Cited

U.S. PATENT DOCUMENTS

| 8,716,746 B2 * | 5/2014 | Koyama | H01L 29/0696 |
| | | | 257/334 |
| 2002/0130331 A1 * | 9/2002 | Nemoto | H01L 29/868 |
| | | | 257/493 |

(Continued)

FOREIGN PATENT DOCUMENTS

| CN | 102683427 A | 9/2012 |
| CN | 103681786 A | 3/2014 |

(Continued)

OTHER PUBLICATIONS

Kopta, A., et al., "A Landmark in Electrical Performance of IGBT Modules Utilizing Next Generation Chip Technologies", International Symposium on Power Semiconductor Devices and ICs, Napoli, Italy, May 2006, 4 pages.

(Continued)

*Primary Examiner* — Natalia A Gondarenko
(74) *Attorney, Agent, or Firm* — Slater Matsil, LLP

(57) ABSTRACT

A power diode comprises a plurality of diode cells (10). Each diode cell (10) comprises a first conductivity type first anode layer (40), a first conductivity type second anode layer (45) having a lower doping concentration than the first anode layer (40) and being separated from an anode electrode layer (20) by the first anode layer (40), a second conductivity type drift layer (50) forming a pn-junction with the second anode layer (45), a second conductivity type cathode layer (60) being in direct contact with the cathode electrode layer (60), and a cathode-side segmentation layer (67) being in direct contact with the cathode electrode layer (30). A material of the cathode-side segmentation layer (67) is a first conductivity type semiconductor, wherein an integrated doping content of the cathode-side, which is integrated along a direction perpendicular to the second main side (102), is below $2 \cdot 10^{13}$ cm$^{-2}$, or a material of the cathode-side segmentation layer (67) is an insulating mate- (Continued)

rial. A horizontal cross-section through each diode cell (10) along a horizontal plane (K1) comprises a first area where the horizontal plane (K1) intersects the second anode layer (45) and a second area where the plane (K1) intersects the drift layer (50).

23 Claims, 14 Drawing Sheets

(58) Field of Classification Search
CPC ......... H01L 29/66143; H01L 29/66219; H01L 29/7455; H01L 29/7808; H01L 29/7821; H01L 29/872; H01L 27/0641; H01L 27/0766; H01L 27/0811; H01L 27/0808; H01L 27/0814; H01L 27/1027; H01L 27/1028; H01L 29/41716; H01L 29/42308; H01L 29/0603; H01L 29/0649; H01L 29/0692; H01L 29/8611; H01L 29/861; H01L 29/8618; H01L 29/862; H01L 29/866; H01L 29/87; H01L 29/88; H01L 29/7397; H01L 27/0635; H01L 29/4236; H01L 29/0615; H01L 29/0684; H01L 29/0696; H01L 29/1095; H01L 29/36
USPC ................ 257/138, 328, 109, 480, 486, 493
See application file for complete search history.

(56) References Cited

U.S. PATENT DOCUMENTS

| | | | |
|---|---|---|---|
| 2005/0017290 A1* | 1/2005 | Takahashi | H01L 29/0696 257/E29.198 |
| 2010/0308446 A1 | 12/2010 | Nakamura | |
| 2012/0228700 A1* | 9/2012 | Nishii | H01L 29/66348 257/E29.256 |
| 2014/0061875 A1* | 3/2014 | Ogura | H01L 29/7802 257/655 |
| 2015/0179636 A1* | 6/2015 | Pfirsch | H01L 29/1095 257/140 |
| 2016/0079235 A1* | 3/2016 | Matsudai | H01L 29/0603 257/140 |
| 2016/0284708 A1* | 9/2016 | Lophitis | H01L 29/0696 |
| 2018/0261700 A1* | 9/2018 | Tanaka | H01L 29/0684 |
| 2018/0315863 A1 | 11/2018 | Masuoka | |
| 2019/0088799 A1* | 3/2019 | Mauder | H01L 29/36 |

FOREIGN PATENT DOCUMENTS

| | | |
|---|---|---|
| CN | 105679835 A | 6/2016 |
| CN | 105990411 A | 10/2016 |
| CN | 108701722 A | 10/2018 |
| DE | 3631136 A1 | 3/1988 |
| EP | 2930753 A1 | 10/2015 |
| EP | 3029737 A1 | 6/2016 |
| JP | H104204434 A | 7/1992 |
| JP | H0629558 A | 2/1994 |
| JP | 2012119716 A | 6/2012 |

OTHER PUBLICATIONS

Chen, Min, et al., "A Novel Diode Struture with Controlled Injection of Backside Holes (CIBH)", Proceedings of the 18th International Symposium on Power Semiconductor Devices & IC's, Naples, Italy, Jun. 4-8, 2006, 4 pages.

Tsukuda, Masanori, et al., "Dynamic Punch-Through Design of High-Voltage Diode for Suppression of Waveform Oscillation and Switching Loss", 2009 International Symposium on Power Semiconductor Devices & IC's, Barcelona, Spain, Jun. 14-18, 2009, 4 pages.

Pfaffenlehner, Manfred, et al., "Optimization of Diodes Using the SPEED Concept and CIBH", Proceedings of the 23rd International Symposium on Power Semiconductor Devices & IC's, San Diego, CA, USA, May 23-26, 2011, 4 pages.

Lophitis, N., et al., "Optimization of Parameters Influencing the Maximum Controllable Current in Gate Commutated Thyristors", IET Circuits & Systems, May 2014, 7 pages.

Kopta, A., et al., "The Field Charge Extraction (FCE) Diode A Novel Technology for Soft Recovery High Voltage Diodes", Proceedings of the 17th International Symposium on Power Semiconductor Devices & IC's, Santa Barbara, CA, USA, May 23-26, 2006, 4 pages.

* cited by examiner

SEGMENTED POWER DIODE STRUCTURE WITH IMPROVED REVERSE RECOVERY

CROSS-REFERENCE TO RELATED APPLICATIONS

This application is a national stage application of International Application No. PCT/EP2020/059271, filed on Apr. 1, 2020, which claims priority to European Patent Application No. 19166711.2, filed on Apr. 2, 2019, which applications are hereby incorporated herein by reference.

FIELD OF THE INVENTION

The present invention relates to semiconductor structures and, in particular embodiments, to a segmented power diode.

BACKGROUND

Snappy recovery of fast power diodes has been investigated for many years in view of the need for faster power semiconductor devices with low switching losses during transient periods. Fast recovery diodes are typically used in combination with integrated gate-commutated thyristors (IGCTs), insulated-gate bipolar transistors (IGBTs) and gate turn-off thyristors (GTOs) as freewheeling diodes, snubber diodes and clamp diodes.

The depletion of remaining stored charge during the recovery period of a power diode results in a current discontinuity (chop-off), manifested by a current slope, dI/dt. The dI/dt operates on the circuit's inductance, leading to a voltage overshoot ($V_L = -L \, dI/dt$) which may result in the destruction of the device. FIG. 1 shows the time dependency of forward current IF and voltage across a power diode during the recovery period. It can be seen from FIG. 1 that at the end of the reverse recovery period, the diode shows snappy turn off behavior (snappy recovery). This is mainly due to an insufficient thickness of the device. The snappy recovery is more pronounced mostly at lower temperatures (25° C.) and lower currents (<10% of the nominal current). The snappy recovery can be reduced by increasing the thickness of the device. However, this in turn causes an increase in conduction and switching losses.

The integrated gate-commutated thyristor (IGCT) has been established as the device of choice for high power applications such as medium voltage drives, pumped hydro, railway interties and power quality applications. Today, IGCTs have been optimized for voltage source inverters (VSIs), current source inverters (CSIs) and event switching (solid-state circuit breaker) applications and are available as asymmetric, symmetric (reverse blocking), and reverse conducting (RC) devices. For VSI topologies, the asymmetric IGCT has the highest power level for a given wafer size while the reverse conducting (RC) IGCT provides compactness (reduction in size and weight) and improves reliability (reduced number of components) by monolithic integration of a power diode on the same wafer as the gate commutated thyristor (GCT).

In an RC-IGCT, as both IGCT and diode are on the same wafer and use same electrical pressure contacts (one at topside and another one at bottom side of the wafer), the choice of the starting silicon material is limited to one thickness. The thickness is governed by the device voltage and cosmic ray resilience ratings, as well as the dynamic behavior of both GCT and diode parts. The latter includes the diode snap-off behavior described above. While increasing the thickness improves all three of the mentioned aspects, it also increases the losses in both operational modes. In a typical optimization of an RC-IGCT, the snap-off behavior dictates the minimal wafer thickness, which is why the motivation for improving this aspect of diode reverse recovery is twofold for an RC-IGCT: both the GCT- and diode parts will benefit from lower operating losses through a thickness decrease.

From EP 3 029 737 A1 it is known a back surface hole injection type diode. By more effectively securing the effect of hole injection from the back surface of a semiconductor substrate, the performance of a semiconductor device is improved. In the diode formed of a P-N junction including an anode P-type layer formed in the main surface of a semiconductor substrate and a back surface $N^+$-type layer formed in the back surface of the semiconductor substrate, a back surface $P^+$-type layer is formed in the back surface, and a surface $P^+$-type layer is formed in the main surface right above the back surface $P^+$-type layer to thereby promote the effect of hole injection from the back surface.

From JP H06-29558 A an electrostatic induction diode is described, which has a planar structure suited for obtaining high breakdown voltage by setting the planar structure using an electrostatic induction effect in one or both of anode and cathode regions and also by setting a life-time distribution in a high-resistance layer. A life-time in the vicinity of anode and cathode sides is set long and a life-time distribution is gradually set short as the distance from these regions increases. The life-time of the position deep from the anode and cathode sides is set comparatively short so that the reduction of residual carrier is accelerated. Therefore, it is possible to realize high breakdown-voltage diode with little inverse-recovery charge quantity and short inverse-recovery time in addition to the effect of electrostatic induction short-circuit.

From DE 3 631 136 A1 it is known a snap-off free diode with a relatively thin silicon layer by implementing the Field Charge Extraction (FCE) concept, i.e. by introducing diode cathode shorts or $p^+$ regions at the diode cathode side. These $p^+$ regions inject holes during tail (end) phase of the reverse recovery period and support the current and hence improve the softness of the device in diode mode of operation without much influence on the performance of the device in GCT mode of operation However, the Safe Operation Area (SOA) or maximum controllable turn-off current (MCC) capability of the device in GCT mode can be low in an RC-IGCT with an integrated power diode having a FCE design as the n-buffer peak doping concentration is usually lower ($<1 \cdot 10^{16}$ $cm^{-3}$) in FCE designs compared with conventional diode design without diode cathode shorts or $p^+$ regions at the diode cathode side. Also, the leakage currents can be higher in these structures with FCE designs as the gain of a parasitic pnp transistor increases with low buffer doping. In addition, the FCE design is more sensitive to temperature variation of the device. The FCE effect is more pronounced, i.e. the carrier injection from the $p^+$ regions becomes higher at higher temperatures which results in increased reverse recovery losses. The strong temperature dependence of the FCE design results in a big difference in the technology curves at Tjmax and at room temperature as a result of the long tail current of the FCE parts.

From the publication "Dynamic Punch-Through Design of High-Voltage Diode for Suppression of Waveform Oscillation and Switching Loss" by Tsukuda et al, Proceedings of the 21$^{st}$ International Symposium on Power Semiconductor Devices & IC's, pp. 128-131, 2009, it is known a power diode design with a silicon oxide region embedded in an n-type cathode layer to cover a portion of the cathode electrode. It is described that such power diode design can suppress oscillation of current and voltage during reverse recovery.

In "Optimization of Diodes using SPEED concept and CIBH" by Pfaffenlehner et al, Proceedings of the 23$^{rd}$ International Symposium on Power Semiconductor Devices & IC's, pp. 108-111, 2011, it is described a free-wheeling diode with improved surge current ruggedness. In this free-wheeling diode according to the SPEED concept an anode consists of highly-doped p$^+$ areas which are located inside a low-doped p-emitter area. At low current densities, hole injection comes mainly out of both p-doped areas but is mainly determined by the p$^+$ areas. However, this diode using the SPEED concept may exhibit snappy reverse recovery when the device thickness is low.

SUMMARY

Embodiments of the present invention relate to a segmented power diode as well as to a reverse conducting (RC) integrated gate-commutated thyristor (IGCT) including such a power diode.

In view of the above disadvantages in the prior art, embodiments of the invention can provide a power diode that exhibits a fast and soft recovery (i.e., no snappy recovery) while reducing the conduction and switching losses in a wide temperature range.

In one embodiment, a power diode comprises an anode electrode layer, a cathode electrode layer and a plurality of diode cells arranged between the anode electrode layer and the cathode electrode layer. A direction from the anode electrode layer to the cathode electrode layer defines a vertical direction (the vertical direction is the direction of a shortest line connecting the anode electrode layer and the cathode electrode layer). Each diode cell comprises a first conductivity type anode layer which is in direct contact with the anode electrode layer, a first conductivity type second anode layer having a lower doping concentration than the first anode layer and being separated from the anode electrode layer by the first anode layer, a second conductivity type drift layer forming a pn-junction with the second anode layer, a second conductivity type cathode layer being in direct contact with the cathode electrode layer, and a cathode-side segmentation layer being in direct contact with the cathode electrode layer. The second conductivity type is different from the first conductivity type. Therein, the cathode layer has a higher doping concentration than that of the drift layer.

A material of the cathode-side segmentation layer is a first conductivity type semiconductor or an insulating material. In case that the cathode-side segmentation layer is a first conductivity type semiconductor, an integrated doping content, which is integrated along a direction perpendicular to the second main side, is below 2·10$^{13}$ cm$^{-2}$. The first anode layer extends in the vertical direction from the anode electrode layer to a first depth and the second anode layer extends in the vertical direction from the first anode layer to a second depth larger than the first depth. A horizontal cross-section through each diode cell along a horizontal plane perpendicular to the vertical direction at a third depth comprises in each diode cell a first area where the horizontal plane intersects the second anode layer and a second area where the horizontal plane intersects the drift layer, wherein the first depth is smaller than the third depth, and the third depth is smaller than the second depth. The drift layer may exemplarily have a constant doping concentration. Therein, a constant doping concentration means that the doping concentration is substantially homogeneous throughout the drift layer, however, without excluding that fluctuations in the doping concentration within the drift layer in the order of a factor of one to five may be possible due to manufacturing reasons.

This design of the power diode of the invention has a segmented structure on the anode and on the cathode side. Specifically, it has a segmented second anode layer on the anode side and a cathode layer being segmented by the cathode-side segmentation layer. The segmented structure of the power diode of the invention improves the reverse recovery of the power diode for a minimum thickness of the power diode (throughout the specification a thickness of a power diode shall refer to a shortest distance between anode and cathode electrode layers). Compared to the FCE diode which relies on injection of holes during the tail (end) phase of the reverse recovery period, characteristics of the power diode of the invention are less temperature dependent. The soft reverse recovery behavior (i.e., the significantly reduced voltage peak during reverse recovery as explained in more detail below with reference to FIG. 6) is, contrary to the FCE diode, not a result of injection of carriers from a p$^+$ region at the cathode side but rather a result of the stored charge left in the unsegmented region.

In a first exemplary embodiment, in at least one vertical cross-section perpendicular to the horizontal plane, the second anode layers of each pair of neighboring diode cells are laterally separated from each other by the drift layers of the respective pair of neighboring diode cells. Throughout the specification, if a first region (or layer) is separated from a second region (or layer) by a third region (or layer), this shall mean that there is no direct contact between the first and the second region but that there is continuous path from the first region to the second region through the third region without passing through any other region.

In the first exemplary embodiment, in the at least one vertical cross-section, the cathode-side segmentation layers of each pair of neighboring diode cells may laterally be separated from each other by the second conductivity type cathode layers of the respective pair of neighboring diode cells. This can further improve the reverse recovery of the power diode.

In the first exemplary embodiment, in the at least one vertical cross-section, a shortest lateral distance $L_{d1}$ between the second anode layers of each pair of neighboring diode cells may be in a range from 0.3·$L_{p1}$ to $L_{p1}$, wherein $L_{p1}$ is a smallest lateral width of the cathode-side segmentation layers in each one of the pair of neighboring diode cells.

In the first exemplary embodiment, in the at least one vertical cross-section, a shortest lateral distance $L_{n1}$ between the cathode-side segmentation layers of each pair of neighboring diode cells may be in a range from 0.3·$W_n$ to $W_n$, wherein $W_n$ is a vertical thickness of the diode cells.

In the first exemplary embodiment, in the at least one vertical cross-section, a lateral width $L_{p1}$ of the cathode-side segmentation layer may be in a range from 0.3·$W_n$ to $W_n$, wherein $W_n$ is a vertical thickness of the diode cell.

In a second exemplary embodiment, in at least one vertical cross-section perpendicular to the horizontal plane, a portion of the drift layer laterally separates the second anode layer in each diode cell into two separate regions laterally extending from the portion of the drift layer to an edge of the diode cell.

In the second exemplary embodiment, in the at least one vertical cross-section, the cathode layers of each pair of neighboring diode cells may be laterally separated from each other by the cathode-side segmentation layers of the respective pair of neighboring diode cells.

In the second exemplary embodiment, in the at least one vertical cross-section, a shortest lateral distance $L_{d2}$ between the two separate regions of the second anode layer in each diode cell of each pair of neighboring diode cells may be in a range from $0.3 \cdot L_{p2}$ to $L_{p2}$, wherein $L_{p2}$ is a shortest lateral distance between the cathode layers of the pair of neighboring diode cells in the at least one vertical cross-section.

In the second exemplary embodiment, in the at least one vertical cross-section, a lateral width $L_{n2}$ of the cathode layer of each diode cell may be in a range from $0.3 \cdot W_n$ to $W_n$, wherein $W_n$ is a vertical thickness of the diode cell.

In the second exemplary embodiment, in the at least one vertical cross-section, a shortest lateral distance $L_{p2}$ between the two cathode-side segmentation layers of each pair of neighboring diode cells may be in a range from $0.3 \cdot W_n$ to $W_n$, wherein $W_n$ is a vertical thickness of the diode cells.

In an exemplary embodiment, the plurality of diode cells all have the same design or structure. The symmetry in a power diode according to such exemplary embodiment allows most homogeneous device characteristics.

In an exemplary embodiment, the power diode has a honeycomb structure, wherein each diode cell has a hexagonal shape in horizontal cross-section. Alternatively, each diode cell may have a stripe shape in horizontal cross-section.

In an exemplary embodiment the power diode comprises a second conductivity type buffer layer. The buffer layer has a doping concentration higher than that of the drift layer and lower than that of the cathode layer. The buffer layer is separated from the cathode electrode layer by the cathode layer and by the cathode-side segmentation layer. The buffer layer is separated from the first anode layer and from the second anode layer by the drift layer. In an exemplary embodiment a peak doping concentration of the buffer layer is higher than $1 \cdot 10^{16}$ cm$^{-3}$ or higher than $2 \cdot 10^{16}$ cm$^{-3}$ or higher than $4 \cdot 10^{16}$ cm$^{-3}$. Contrary to the FCE design, the concept of the invention is independent of the buffer design i.e. the peak doping of the buffer is not limited to values below a certain limit as it is the case for the FCE design. With a higher peak doping of the buffer layer, the power diode of the invention is less sensitive to temperature variations.

The power diode of the invention may be integrated together with a gate-commutated thyristor (GCT) in a reverse conducting integrated gate-commutated thyristor (RC-IGCT) device. A soft reverse recovery behavior of the device in diode mode is obtained with a minimum thickness of the device. Therefore, the efficiency of the device can be improved both in diode- and GCT mode of operation while ensuring soft recovery behavior.

BRIEF DESCRIPTION OF THE DRAWINGS

Detailed embodiments of the invention will be explained below with reference to the accompanying figures, in which.

Figure 1:
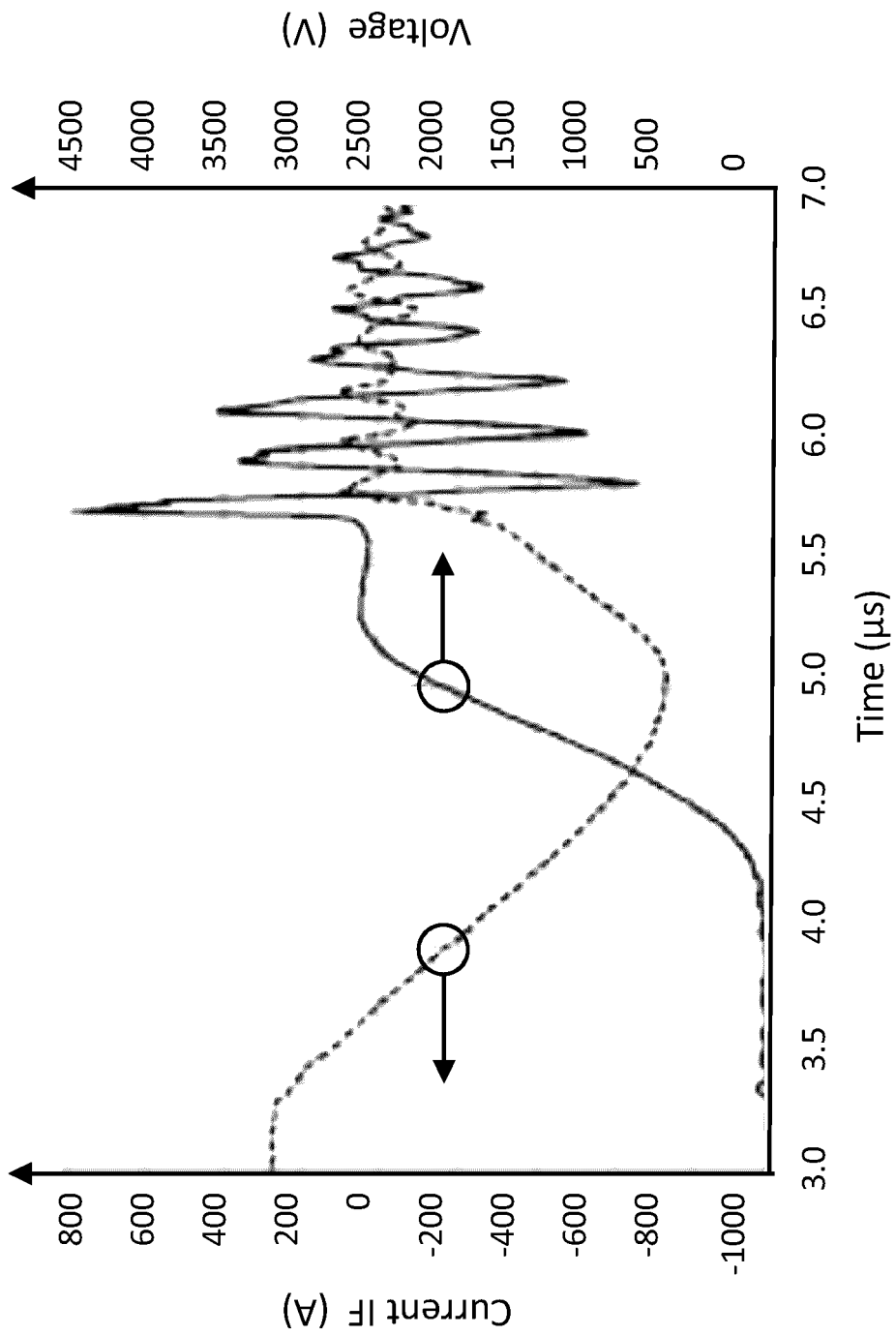
FIG. 1 illustrates time dependency of current and voltage during snappy recovery of a conventional power diode.

The reference signs used in the figures and their meanings are summarized in the list below. Generally, similar elements have the same reference signs throughout the specification. The described embodiments are meant as examples and shall not limit the scope of the invention. Similar reference signs comprising the same reference numeral but having different number of dashes (e.g. reference signs 100, 100', 100'', 100''') refer to similar elements/entities in different embodiments. The description of features for one of these similar reference signs shall apply to all elements/entities referenced by these reference signs, except where it is describe otherwise.

| | |
|---|---|
| 5 | edge termination |
| 10, 10', 10'', 10''' | diode cell |
| 20 | anode electrode layer |
| 30 | cathode electrode layer |
| 40, 40'' | first anode layer |
| 45, 45', 45'', 45''' | second anode layer |
| 50, 50', 50'', 50''' | drift layer |
| 60, 60', 60''' | cathode layer |
| 67, 67', 67''' | cathode-side segmentation layer |

| | |
|---|---|
| 80 | insulation layer |
| 90 | RC-IGCT |
| 91, 91', 91", 91''', 910 | power diode |
| 92 | separation region |
| 93 | gate commutated thyristor (GCT) |
| 94 | gate contact |
| 100, 100', 100", 100''' | semiconductor wafer |
| 101, 101', 101", 101''' | first main side |
| 102, 102', 102", 102''' | second main side |
| 110 | incomplete cell |
| K1, K1', K1", K1''' | first horizontal plane |
| K2, K2', K2", K2''' | second horizontal plane |
| Ld1 | shortest lateral distance (between second anode layers of two neighboring diode cells) |
| Ln1 | shortest lateral distance (between cathode-side segmentation layers of two neighboring diode cells) |
| Lp1 | lateral width (of cathode-side segmentation layer) |
| Ld2 | shortest lateral distance (between two separate regions of the second anode layer) |
| Ln2 | lateral width (of cathode-side segmentation layer) |
| Lp2 | shortest lateral distance (between cathode layers of two neighboring diode cells |
| Wn | vertical thickness of the diode cells |

DETAILED DESCRIPTION OF ILLUSTRATIVE EMBODIMENTS

Figure 2:
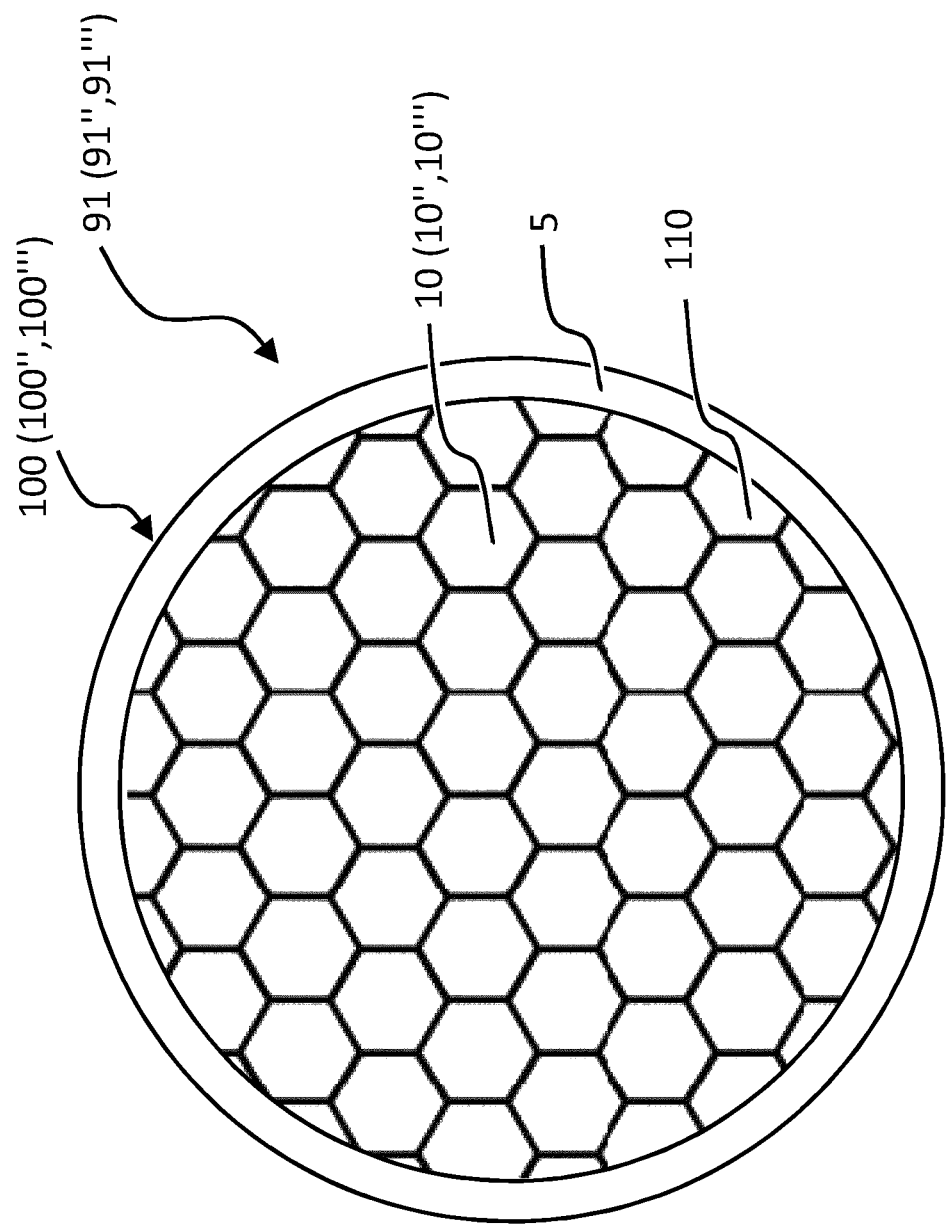
FIG. 2 shows a top view of power diode according to a first, third and fourth embodiment.

In the following there is described a power diode 91 according to a first embodiment of the invention with reference to FIGS. 2 to 6 (the reference signs in parentheses relate to other embodiments discussed in detail further below). FIG. 2 shows the power diode 91 in top view, FIG. 3 is a horizontal cross-section of nine diode cells 10 included in the power diode 91 along line I-I' in FIG. 5, FIG. 4 is a horizontal cross-section of nine diode cells 10 included in the power diode 91 along line II-II' in FIG. 5, and FIG. 5 shows a cross-section of the power diode 91 along any one of lines A-A', B-B' and C-C' in FIGS. 3 and 4, respectively (in the power semiconductor device 91 the cross-section along line A-A' is the same as the cross-section along line B-B' and is also the same as the cross-section along line C-C').

Figure 4:
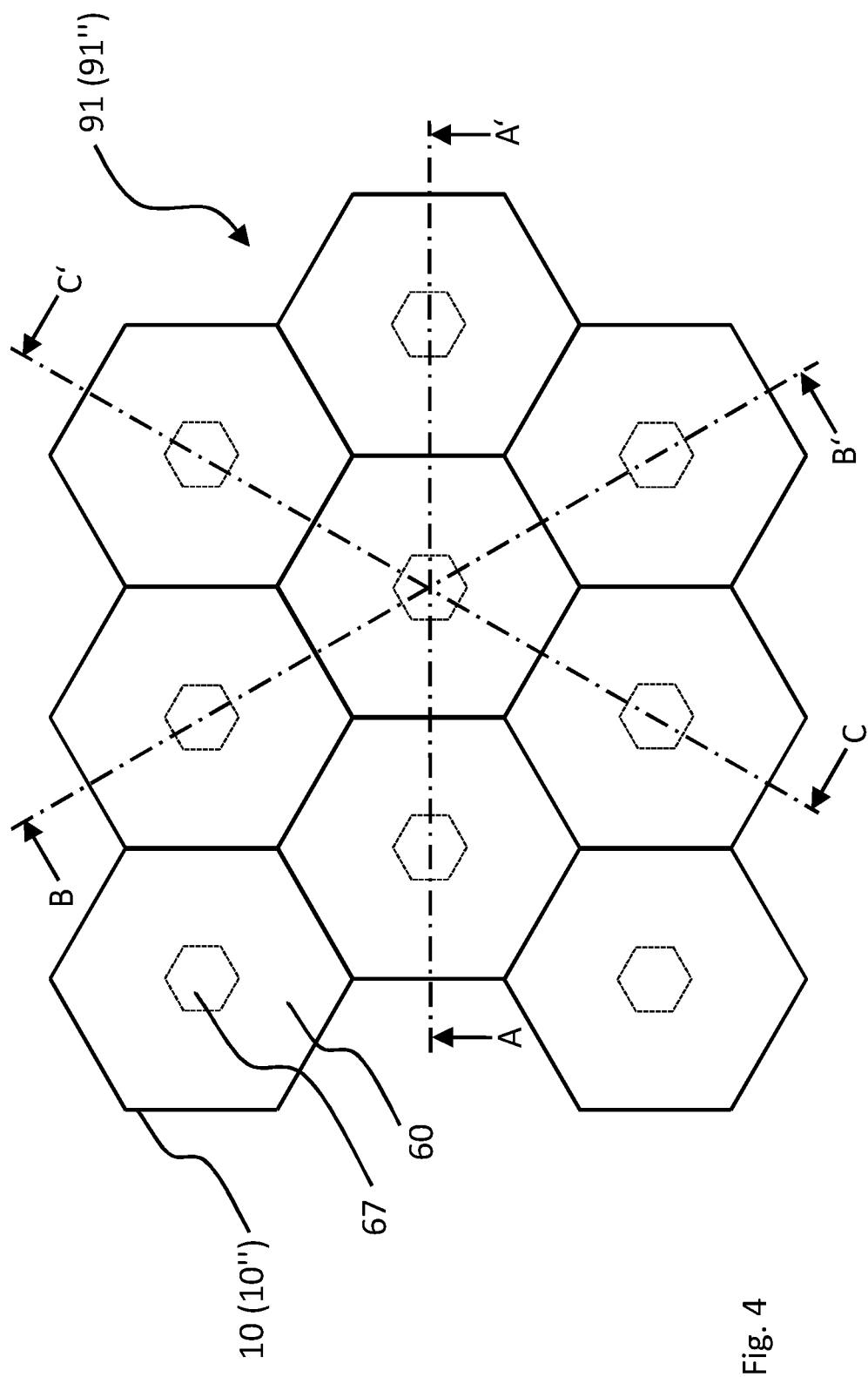
FIG. 4 is a horizontal cross-section of nine diode cells included in the power diode according to the first embodiment along line II-II' in FIG. 5.
Figure 5:
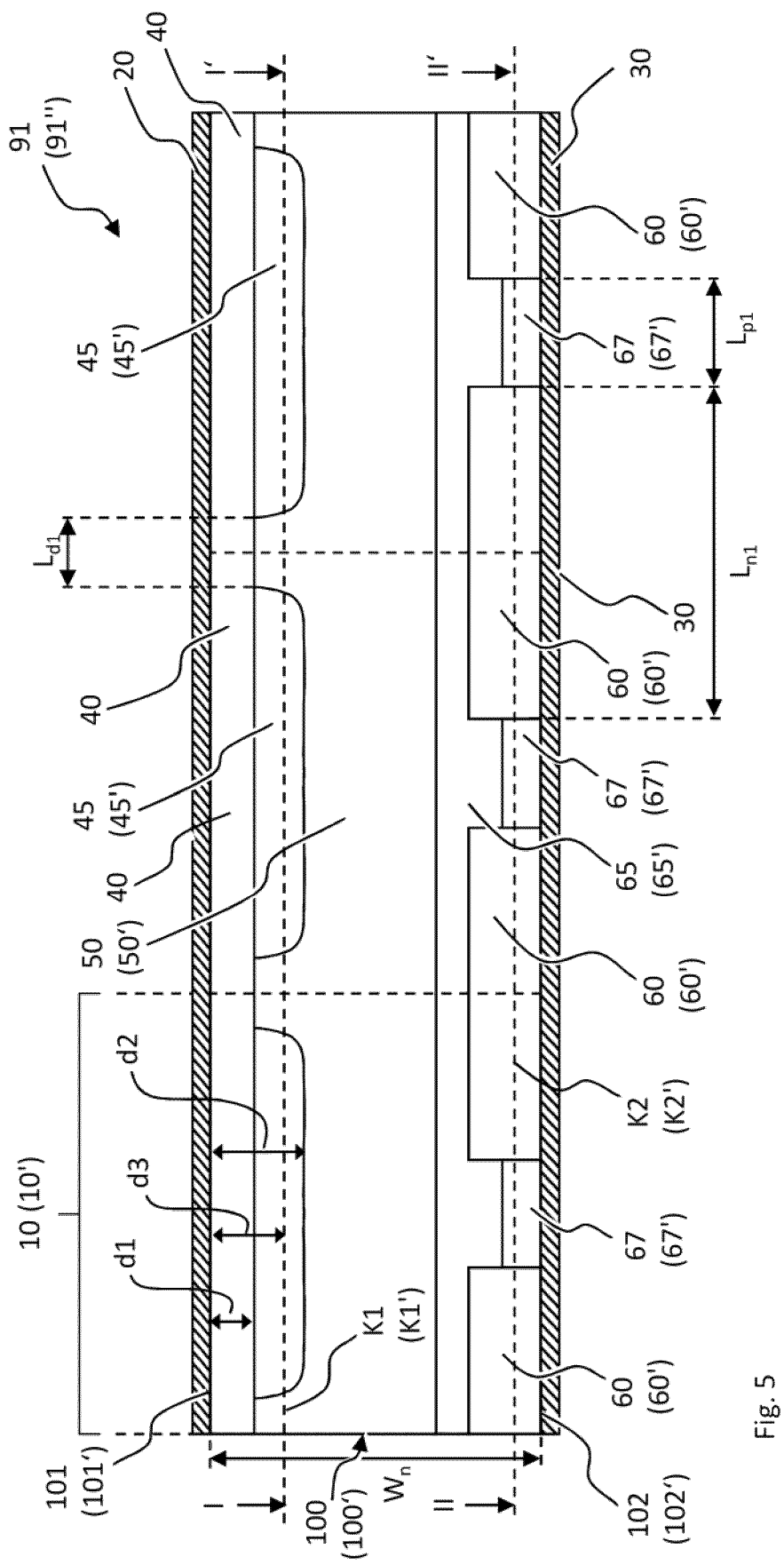
FIG. 5 shows a vertical cross-section of the power diode of the first embodiment along any one of lines A-A', B-B' and C-C' in FIGS. 3 and 4, respectively.

The power diode 91 comprises a semiconductor wafer 100 having a first main side 101 and a second main side 102 as shown in FIG. 5. As can be seen from FIG. 2, the semiconductor wafer 100 includes an active region laterally surrounded by an edge termination region 5. In the active region the power diode 91 comprises a plurality of diode cells 10. Except for incomplete cells 110 which are directly adjacent to the edge termination region 5, all diode cells 10 may have the same structure, which is exemplarily a hexagonal structure. The hexagonal structure is characterized by a hexagonal outer shape in top view (i.e. in a view in a direction orthogonal to the first main side 101, which is a vertical direction). The diode cells 10 having the hexagonal structure form a honeycomb pattern in top view as shown in FIG. 2. Incomplete cells 110 directly adjacent to the edge termination region 5 may have, compared to the diode cells 10 which are not directly adjacent to the edge termination region 5, a different structure which includes only a part of the hexagonal structure of the diode cells 10. In the horizontal cross-sections of FIGS. 3 and 4 nine neighboring diode cells 10 having the same hexagonal structure are shown respectively.

Figure 3:
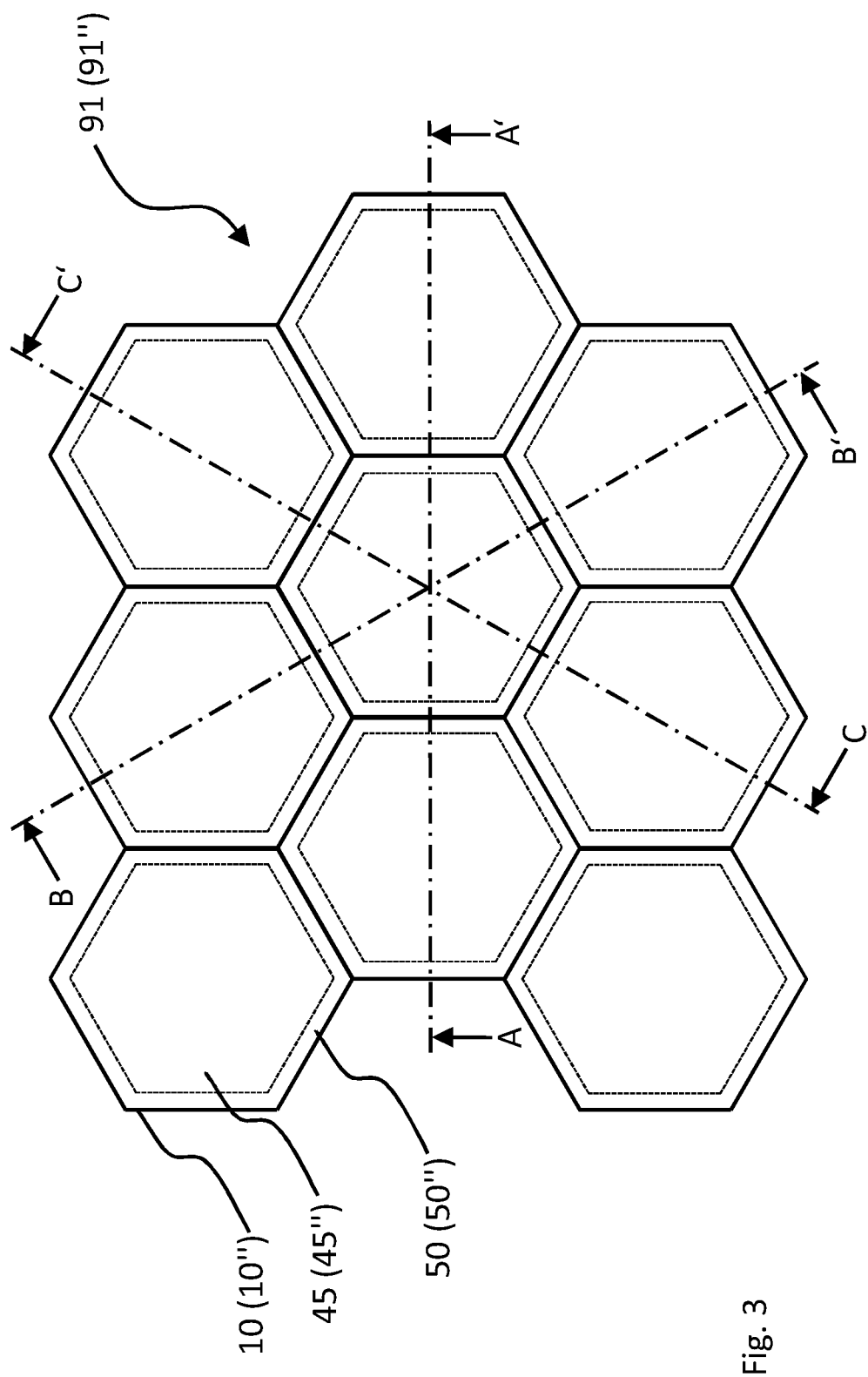
FIG. 3 is a horizontal cross-section of nine diode cells included in the power diode according to the first embodiment along line I-I' in FIG. 5.

In FIGS. 2 to 4 solid lines represent the boundaries between neighboring diode cells 10, whereas thin dashed lines in FIG. 3 illustrate the boundaries (i.e. the outer edges or peripheries) of p-type second anode layers 45 in a first horizontal plane K1 along line I-I' in FIG. 5 and thin dashed lines in FIG. 4 illustrate the boundaries of cathode-side segmentation layers 67 in a second horizontal plane K2 along line II-II' in FIG. 5. As shown in FIGS. 3 and 4 the boundaries of the p-type second anode layers 45 and the boundaries of the cathode-side segmentation layers 67 may be hexagonal similar to the outer shape of the diode cells 10 in top view.

FIG. 5 shows three neighboring (i.e. directly adjacent) diode cells 10 in cross-section along any one of lines A-A', B-B' and C-C' in FIGS. 3 and 4, respectively. As shown in FIG. 5 the power diode 91 comprises an anode electrode layer 20 formed on the first main side 101 of the semiconductor wafer 100 and a cathode electrode layer 30 formed on the second main side 102 of the semiconductor wafer 100. The anode electrode layer 20 and the cathode electrode layer 30 cover at least a portion of each diode cell 10. Exemplarily, the anode electrode layer 20 and the cathode electrode layer 30 may respectively be formed as a continuous metallization layer on the first main side 101 and on the second main side 102, respectively.

Accordingly, the diode cells 10 in the semiconductor wafer 100 are arranged between the anode electrode layer 20 and the cathode electrode layer 30. Each diode cell 10 includes a p-type first anode layer 40 which is in direct contact with the anode electrode layer 20, the second anode layer 45 which is separated from the anode electrode layer 20 by the first anode layer 40 (along any straight vertical line from the anode electrode layer 20 to the cathode electrode layer 30, wherein a vertical direction is a direction from the anode electrode 20 to the cathode electrode layer 30 along a shortest line connecting the anode electrode 20 with the cathode electrode layer 30), an n-type drift layer 50 forming a pn-junction with the second anode layer 45, an n-type buffer layer 65, an n-type cathode layer 60 being in direct contact with the cathode electrode layer 30, and a cathode-side segmentation layer 67 being in direct contact with the cathode electrode layer 30 and alternating with the cathode-side segmentation layer 67. The buffer layer 65 is separated from the first anode layer 40 and from the second anode layer 45 by the drift layer 50, and the buffer layer 65 is separated from the cathode electrode layer 30 by the cathode layer 60 and the cathode-side segmentation layer 67. The second anode layer 45 may be a well region within the drift layer 50.

The power diode 91 according to the first embodiment may be a silicon based power diode, i.e. semiconductor wafer 100 including the first anode layer 40, the second anode layer 45, the n-type drift layer 50, the n-type buffer layer 65 and the n-type cathode layer 60 may be made of silicon.

The first anode layer 40 in the power diode 91 according to the first embodiment is a continuous layer shared by the plurality of diode cells 10. In all diode cells 10 of the plurality of diode cells 10 the first anode layer 40 may have a constant thickness d1 in a direction perpendicular to the first main side 101, i.e. the first anode layer 40 extends in the vertical direction from the surface 101 of the semiconductor wafer 100 to a first depth d1. The second anode layer 45 extends in the vertical direction from the first anode layer 40 to a second depth d2.

The second anode layers 45 of each pair of neighboring diode cells 10 are laterally separated from each other by portions of the n-type drift layer 50 of the respective pair of neighboring diode cells 10. More specifically, the second anode layer 45 of each diode cell 10 is laterally surrounded and separated from the periphery of the diode cell 10 by a portion of the drift layer 50 as shown in FIGS. 3 and 5. Throughout the specification a lateral direction shall refer to a direction parallel to the first main side 101 or the second main side 102. Accordingly, the second anode layer 45 of each diode cell 10 is laterally surrounded and separated from the periphery of the diode cell 10 by a portion of the drift layer 50 in in an orthogonal projection onto a plane parallel to the first main side 101 (or parallel to the second main side 102). Accordingly, the horizontal cross-section through each diode cell 10 along the first horizontal plane K1 perpendicular to the vertical direction at a third depth d3 comprises in each diode cell 10 a first area where the first horizontal plane K1 intersects the second anode layer 45 and a second area where the first horizontal plane K1 intersects the drift layer 50, wherein the third depth d3 is a depth between the depth d1 to which the first anode layer 40 extends and the second depth d2 to which the second anode layer 45 extends.

In the vertical cross-section shown in FIG. 5 the shortest lateral distance between two second anode layers 45 of each pair of neighboring diode cells 10 is referred to as $L_{d1}$. Due to the identity of the structure or design of the diode cells 10 in the power diode 91, a distance between the anode layer 45 of a diode cell 10 to the periphery of that diode cell 10 is $L_{d1}/2$, and the distance $L_{d1}$ between two neighboring second anode layers 45 in the cross-section shown in FIG. 5 is the same for all pairs of directly adjacent diode cells 10.

Accordingly, a p-type region comprising the first anode layer 40 and the second anode layer 45 has the first depth d1 at the periphery of the diode cell 10 and has the second depth d2 in the lateral center of the diode cell 10, wherein the second depth d2 is larger than the first depth d1. Exemplarily a thickness of the first anode layer 40 in a direction perpendicular to the first main side 101 is in a range between 2 μm to 80 μm, i.e. the first depth d1 is in a range between 2 μm and 80 μm. A thickness of the second anode layer 45 in the direction perpendicular to the first main side 101 is exemplarily in a range between 50 μm and 200 μm, i.e. a difference d2−d1 between the second depth d2 and the first depth d1 is in a range between 50 μm and 200 μm. The first anode layer 40 comprises a first doping concentration of a first p-type dopant and the second anode layer 45 comprises a second doping concentration of a second p-type dopant, which has a lower surface concentration than the first p-type dopant. Exemplarily, the first p-type dopant is different from the second p-type dopant, for example the first p-type dopant may boron (B) and the second p-type dopant may be aluminum (Al).

A peak doping concentration of the first anode layer 40 is higher than a peak doping concentration of the second anode layer 45. Exemplarily, the peak doping concentration of the first anode layer 40 is above $5 \cdot 10^{17}$ cm$^{-3}$ and the peak doping concentration of the second anode layer 45 is below $5 \cdot 10^{17}$ cm$^{-3}$.

The drift layer 50 is shared by all diode cells 10 and extends in an orthogonal projection onto a plane parallel to the first main side 101 in the whole area of each diode cell 10, i.e. the drift layer 50 extends laterally through each diode cell 10. The drift layer 50 forms a pn-junction with the first anode layer 40 in areas where the first anode layer 40 is not overlapped with the second anode layer 45 in the orthogonal projection onto the plane parallel to the first main side 101. In areas where the first anode layer 40 is overlapped with the second anode layer 45 in the orthogonal projection onto the plane parallel to the first main side 101, the drift layer 50 forms a pn-junction with the second anode layer 45. The thickness of the drift layer 50 depends on the voltage class of the power diode. A doping concentration of the drift layer 50 is relatively low (low compared to the doping concentration exemplarily of the other layers like the buffer layer 65), exemplarily below $5 \cdot 10^{13}$ cm$^{-3}$ depending on the voltage class of the power diode 91. The drift layer 50 may have a constant doping concentration. Therein, a constant doping concentration means that the doping concentration is substantially homogeneous throughout the drift layer 50, however without excluding that fluctuations in the doping concentration within the drift layer 50 in the order of a factor of one to five may be possible due to manufacturing reasons. A doping concentration of the buffer layer 65 is higher than that of the drift layer 50. Exemplarily, the buffer layer 65 may have a rising doping concentration towards the second main side 102. A peak doping concentration of the buffer layer 65 is exemplarily higher than $1 \cdot 10^{16}$ cm$^{-3}$, exemplarily higher than $2 \cdot 10^{16}$ cm$^{-3}$ or more exemplarily higher than $4 \cdot 10^{16}$ cm$^{-3}$. In the horizontal cross-section as shown in FIG. 4, the cathode-side segmentation layer 67 is located in the lateral center of the diode cell 10 surrounded by the n-type cathode layer 60. Accordingly, in top view (orthogonal projection onto a horizontal plane) the second anode layer 45 fully overlaps the cathode-side segmentation layer 67.

A material of the cathode-side segmentation layer 67 is either a p-type semiconductor or an electrically insulating material, such as silicon oxide or oxynitride. The material of the cathode-side segmentation layer 67 may be any material that can inhibit electron emission from the buffer layer 65 into the drift region during diode conduction in an area adjacent to or above the cathode-side segmentation layer 67. The thickness of the cathode-side segmentation layer 67 is less than a thickness of the highly n-type doped cathode layer 60. The doping concentration of the cathode layer 60 is significantly higher than that of the buffer layer and may be for example above $10^{18}$ cm$^{-3}$.

Contrary to the known FCE diode, which requires significant hole injection to soften the collapse of the current as the electric field sweeps out the last charge close to the buffer (i.e. the FCE diode needs a strong p-emitter), the segmented power diode 91 of the invention does not require any injection of holes from the cathode side. Quite to the contrary, FCE action, i.e. significant injection of holes, is not desirable because it is temperature dependent and gives the strongest effect at high temperatures where it is least needed. In case that the segmentation layer 67 is made of an insulating material there is no injection of holes. On the other side, in case that the cathode-side segmentation layer 67 is made of a p-type semiconductor material, it is desirable that the emitter efficiency is relatively low. The emitter efficiency of a p-type cathode-side segmentation layer 67 depends basically on the doping concentration of the cathode-side segmentation layer 67 and on its depth (i.e. thickness in a direction perpendicular to second main side 102). The dose or integrated doping content (integrated along a direction perpendicular to the second main side 102) of the cathode-side segmentation layer 67 is below $2\cdot10^{13}$ cm$^{-2}$ or exemplarily below $1\cdot10^{13}$ cm$^{-2}$ or more exemplarily below $5\cdot10^{12}$ cm$^{-2}$. Therein the doping content refers to an activated dopant. The lower the p-type dose the lower the emitter efficiency of the p-type cathode-side segmentation layer 67 for injection of holes. Employing a p-type material for the cathode segmentation layer 67 may facilitate the manufacturing of the power diode compared to a case where an insulating material is used for the cathode segmentation layer 67.

Like the second anode layers 45 also the cathode-side segmentation layers 67 are segmented. The cathode-side segmentation layers 67 of each pair of neighboring diode cells 10 are laterally separated from each other by the n-type cathode layers 60 of the respective pair of neighboring diode cells 10. More specifically, as can be seen from the vertical cross-section shown in FIG. 5 and the horizontal cross-section shown in FIG. 4, the cathode-side segmentation layer 67 of each diode cell 10 is laterally (i.e. in the orthogonal projection onto a plane parallel to the first main side 101 or the second main side 102) surrounded and separated from the periphery of the diode cell 10 by a portion of the n-type cathode layer 60. A shortest lateral distance between two cathode-side segmentation layers 67 of each pair of neighboring diode cells 10 is referred to as $L_{n1}$ in the vertical cross-section shown in FIG. 5. Due to the identity of the structure or design of the diode cells 10, the distance between the cathode-side segmentation layer 67 of a diode cell 10 to the periphery of that diode cell 10 is $L_{n1}/2$. A lateral width of the cathode-side segmentation layer 67 of a diode cell 10 is referred to as $L_{p1}$ in the vertical cross-section shown in FIG. 5.

Relationships (design rules) between the lateral width $L_{p1}$ of the cathode-side segmentation layer 67 of each diode cell, the shortest lateral distance $L_{n1}$ between two cathode-side segmentation layers 67 of each pair of neighboring diode cells 10, the shortest lateral distance $L_{d1}$ between the second p-type layers 45 of each pair of neighboring diode cells 10 and the thickness $W_{n1}$ of each diode cell 10 may be the following:

$$0.3\cdot L_{p1} \leq L_{d1} \leq L_{p1} \quad \text{(i)}$$

$$0.3\cdot W_{n1} \leq L_{n1} \leq W_{n1} \quad \text{(ii)}$$

$$0.3\cdot W_{n1} \leq L_{p1} \leq W_{n1} \quad \text{(iii)}$$

Figure 6:
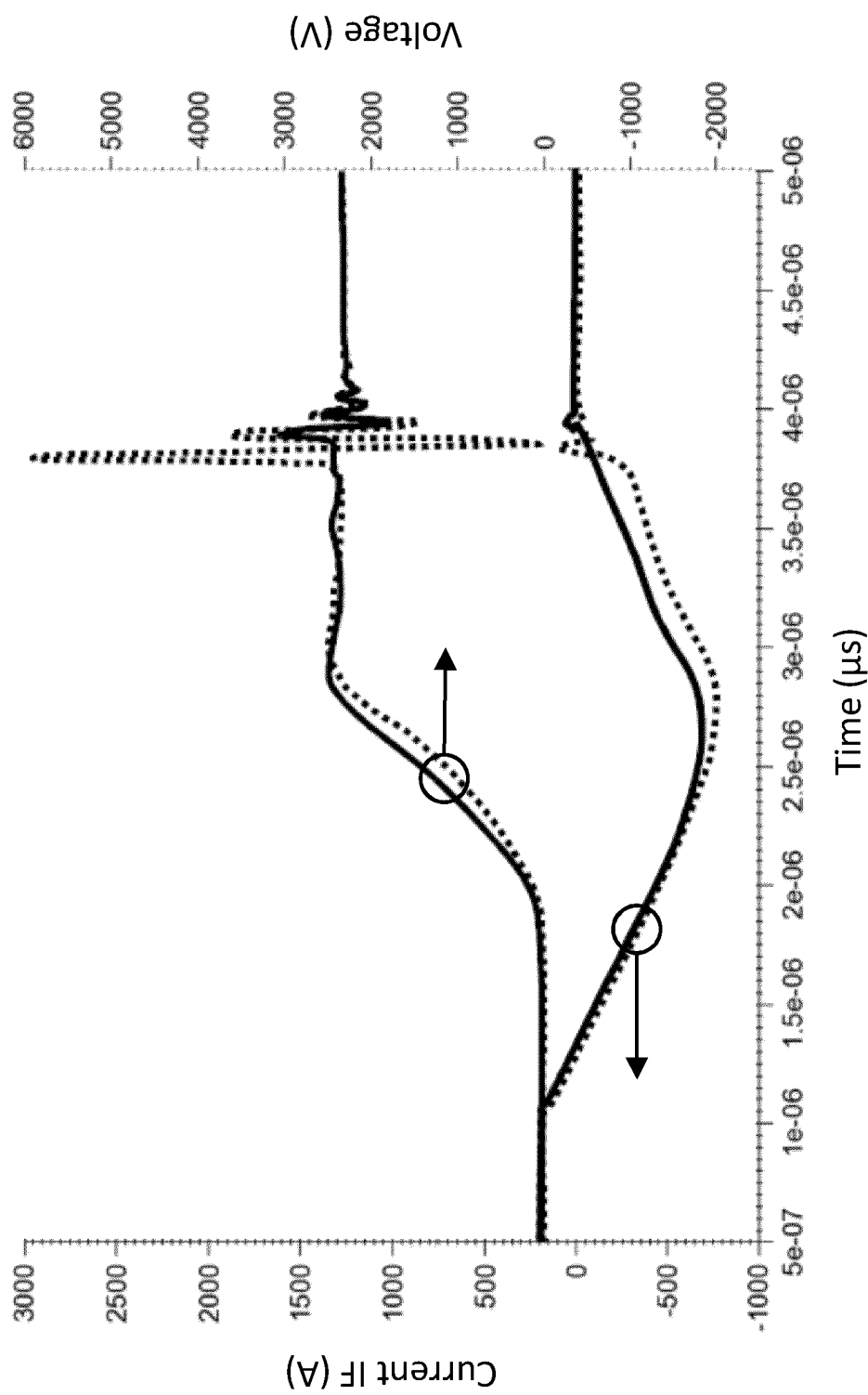
FIG. 6 shows a time dependency of current and voltage during a reverse recovery period for the power diode according to the first embodiment and for a conventional (unsegmented) power diode.

In FIG. 6 there is shown a time dependency of current and voltage during a reverse recovery period for the power diode 91 according to the first embodiment and for a conventional unsegmented power diode (conventional PiN diode) as a comparison. The solid lines in the graph of FIG. 6 correspond to the current and voltage of the power diode 91 according to the first embodiment, and the dashed lines correspond to the current and voltage of the conventional unsegmented power diode. As can be seen clearly from FIG. 6 the power diode 91 of the invention shows a soft recovery behavior whereas the conventional power diode shows a snappy reverse recovery behavior with pronounced oscillations of the voltage.

In the following a power diode 91' according to a second embodiment will be explained with reference to FIGS. 5, and 7 to 9. Due to many similarities between the power diode 91 according to the first embodiment and the power diode 91' according to the second embodiment, not all features which are the same for the two power diodes 91 and 91' according to the first and the second embodiment will be repeated in the following. The description of the power diode 91' according to the second embodiment will focus on the differences between the first and the second embodiments, whereas with all other features it is referred to the description of the first embodiment above. In particular, same reference signs in the drawings refer to similar elements that have the same characteristics or features.

The power diode 91' according to the second embodiment differs from the power diode 91 according to the first embodiment in that each diode cell 10' of the power diode 91' has a stripe shape in horizontal cross-section. This can be seen in FIG. 7 which shows three diode cells 10' of the power diode 91' in a first horizontal cross-section along line I-I' in FIGS. 5 and 9, and in FIG. 8 which shows these three diode cells 10' in a second horizontal cross-section along line II-II' in FIGS. 5 and 9, respectively. FIG. 5 shows a first vertical cross-section of these three diode cells 10' along line D-D' in FIGS. 7 and 8, respectively. Accordingly, the cross-section of diode cells 10' along line D-D' in FIGS. 7 and 8 looks the same as the cross-section of the diode cells 10 along any one of lines A-A', B-B' and C-C' in FIGS. 3 and 4, respectively. Reference signs related exclusively to the second embodiment are shown in FIG. 5 in parentheses. In particular the cross-sections of the stripe shaped p-type second anode layers 45' and of the stripe shaped cathode-side segmentation layers 67' along line D-D' are the same as the cross-sections of second anode layer 45 and of the cathode-side segmentation layers 67 along lines A-A', B-B', and C-C' in FIGS. 3 and 4, respectively.

Figure 7:
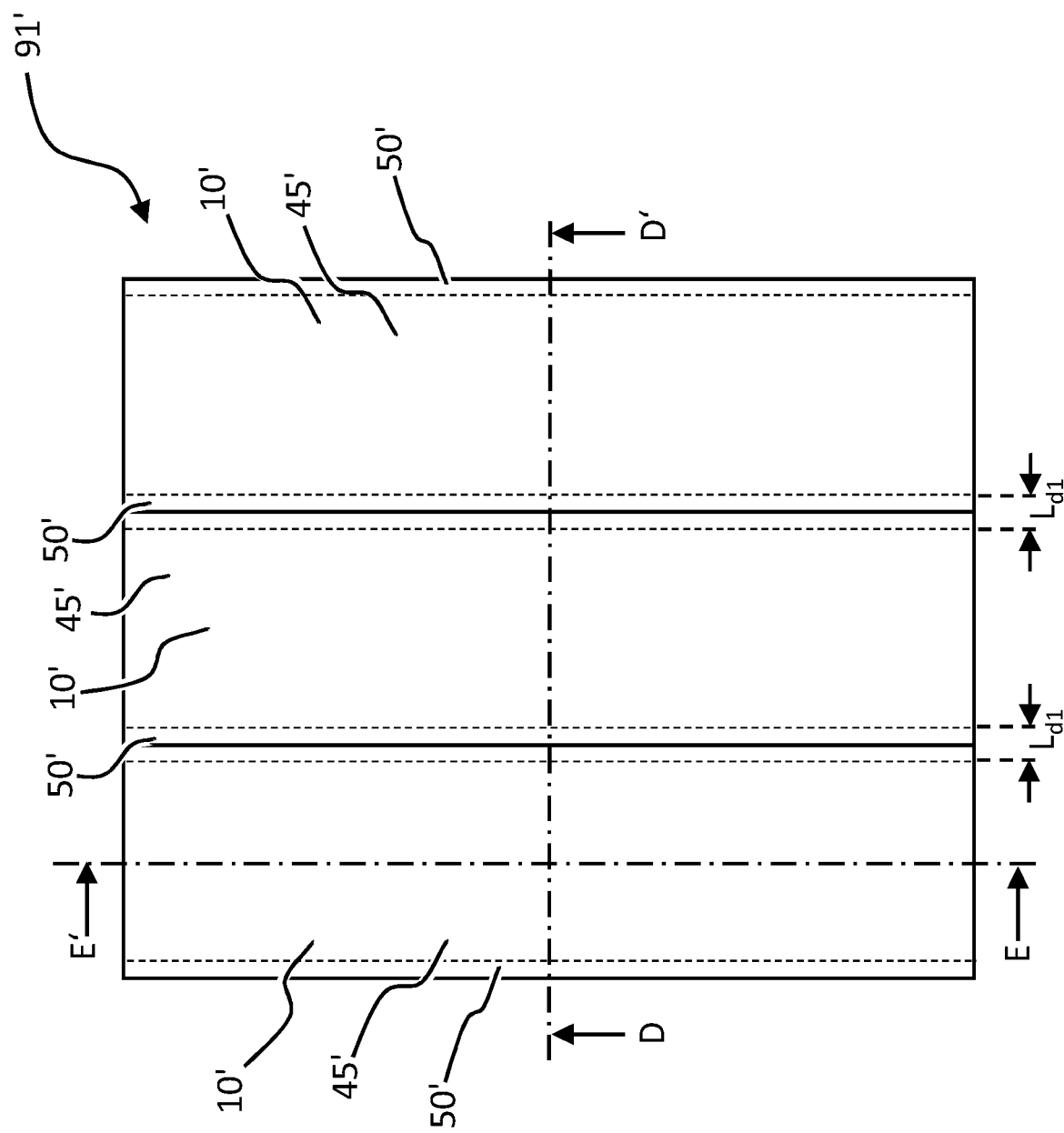
FIG. 7 shows a horizontal cross-section of a power diode according to a second embodiment along line I-I' in FIG. 9.
Figure 8:
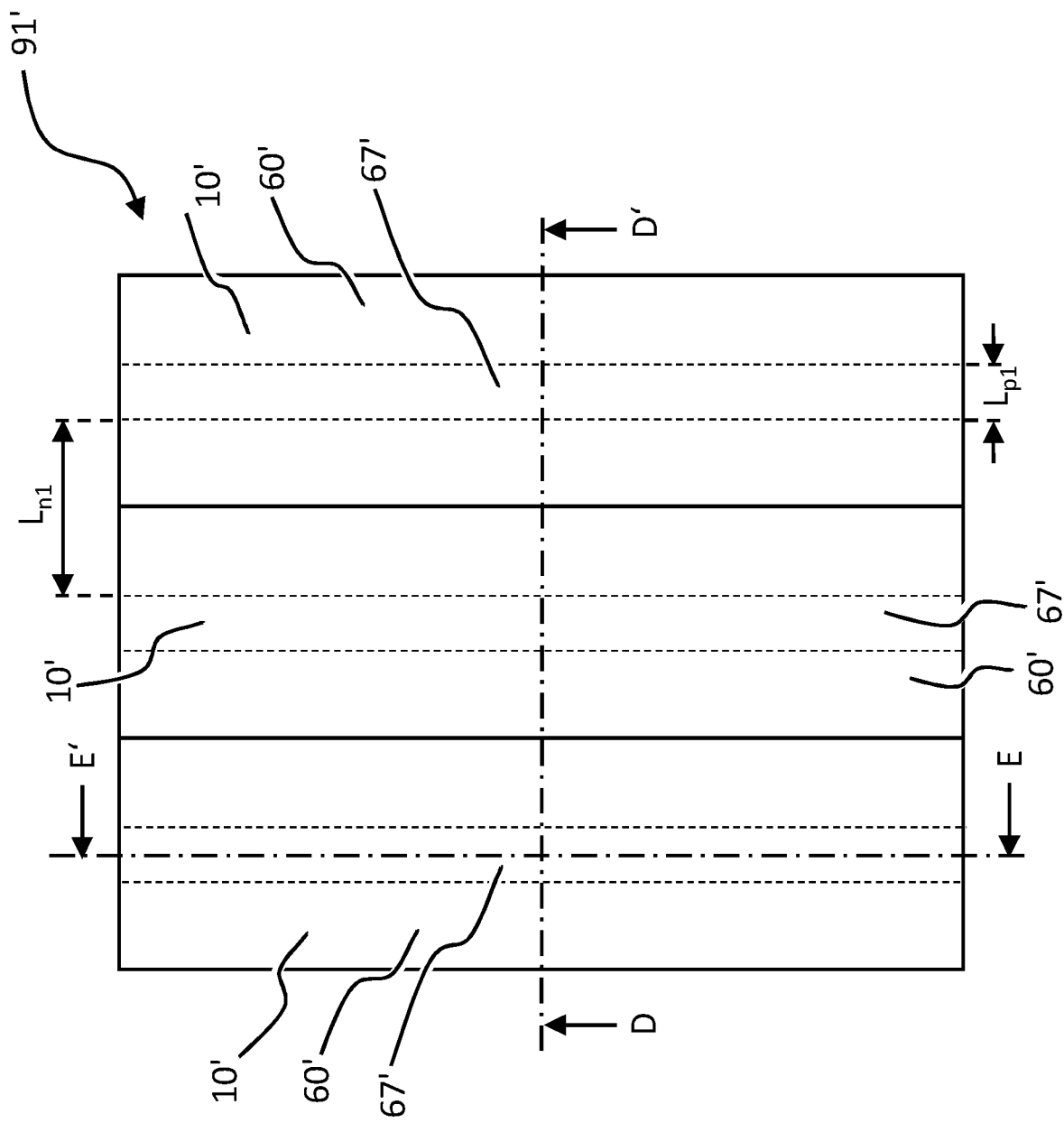
FIG. 8 shows a horizontal cross-section of a power diode according to the second embodiment along line II-II' in FIG. 9.

In the second embodiment, a semiconductor wafer 100' a partial vertical cross-section of which is shown in FIG. 5 has a first main side 101" and a second main side 102" and is similar to the semiconductor wafer 100 described above. It differs from the above described semiconductor wafer 100 only in the different shape of the second anode layer 45', the drift layer 50', the buffer layer 65', the cathode layer 60' and of the cathode segmentation layer 67' due to the above described stripe-shape of the diode cells 10'. Like the power diode 91, the power diode 91' may have more than three diode cells 10'. In addition, the power diode 91' may have an edge termination region 5 and incomplete diode cells 110 adjacent to the edge termination region as described above for the first embodiment. In the horizontal cross-sections of FIGS. 7 and 8 the solid lines represent the boundaries between neighboring diode cells 10', whereas thin dashed lines in FIG. 7 illustrate the boundaries of second anode layers 45' in a first horizontal plane K1' along line I-I' in FIGS. 5 and 9, and thin dashed lines in FIG. 8 illustrate the boundaries of cathode-side segmentation layers 67' in a second horizontal plane K2' along line II-II' in FIGS. 5 and 9. In top view, i.e. in an orthogonal projection onto a plane perpendicular to the vertical direction, as well as in the first and second horizontal cross-sections shown in FIGS. 7 and 8, each one of the second anode layers 45' and of the cathode-side segmentation layers 67' has a stripe shape. A longitudinal axis of the stripe shaped second anode layers 45' and of the stripe shaped cathode-side segmentation layers 67' extends along line E-E' in FIGS. 7 and 8, i.e. in the left-right direction in FIG. 9, throughout the whole diode cell 10'. In the horizontal cross-section of FIG. 7 stripe-shaped regions of the drift layer 50' alternate with stripe-shaped regions of the second anode layers 45'. Likewise, in the horizontal cross-section shown in FIG. 8 stripe shaped regions of the cathode layers 60' with stripe-shaped regions of the cathode segmentation layers 67".

Similar to the above described first embodiment, in the vertical cross-section shown in FIG. 5, a shortest lateral distance $L_{d1}$ between two second anode layers 45' of each pair of neighboring diode cells 10' (which are neighboring in a direction parallel to line D-D' in FIGS. 7 and 8, respectively), a shortest lateral distance $L_{n1}$ between two cathode-side segmentation layers 67' of each pair of neighboring diode cells 10', a lateral width $L_{p1}$ of each cathode-side segmentation layer 67' in a direction parallel to line D-D' in FIGS. 7 and 8, respectively, and the thickness $W_n$ of each diode cell 10' may exemplarily fulfil the above indicated design rules (i) to (iii).

In the following a power diode 91" according to a third embodiment will be explained with reference to FIGS. 2 to 4, and 10. Therein, FIG. 3 shows a horizontal cross-section of diode cells 10" of the power diode 91" along line I-I' in FIG. 10 (along plane K1" in FIG. 10), and FIG. 4 shows another horizontal cross-section of these diode cells 10" along II-II" in FIG. 10 (i.e. along plane K2" in FIG. 10). Due to many similarities between the power diode 91 according to the first embodiment and the power diode 91" according to the third embodiment not all features, which are the same for the two power diodes 91 and 91", will be repeated in the following. The description of the power diode 91" according to the third embodiment will focus on the differences between the first embodiment and the third embodiment, whereas with all other features it is referred to the description of the first embodiment above. In particular, same reference signs in the drawings refer to similar elements that have the same characteristics or features.

Figure 10:
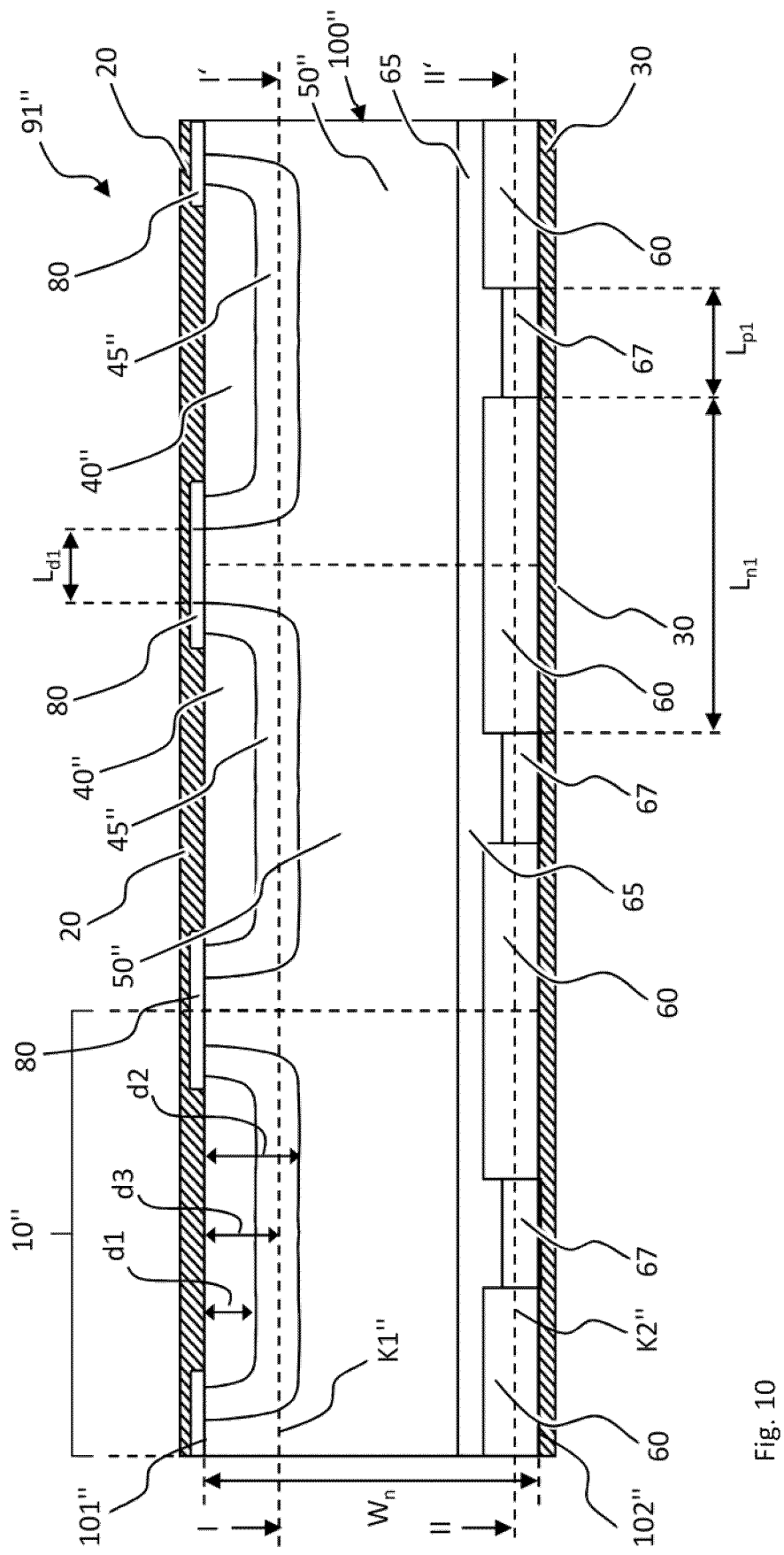
FIG. 10 shows a power diode according to the third embodiment in cross-section along any one of lines A-A', B-B' and C-C' in FIGS. 3 and 4, respectively.

The power diode 91" of the third embodiment differs from the power diode 91 according to the first embodiment as described above with reference to FIGS. 2 to 5 only in a different shape of the p-type first anode layer 40" and of the p-type second anode layer 45". In the third embodiment the first anode layer 40" is configured as a well region within the second anode layer 45". The top view of the power diode 91" according to the third embodiment is the same as the top view of the power diode 91 according to the first embodiment shown in FIG. 2. Reference signs related exclusively to the third embodiment are shown in FIGS. 2, 3 and 4 in parentheses. A cross-section of the power diode 91" along any one of lines A-A', B-B', and C-C' in FIGS. 3 and 4, is shown in FIG. 10. Due to the modified shape of the first anode layer 40" and of the second anode layer 45", a drift layer 50" differs from the drift layer 50 in the first embodiment in that it is not in direct contact with but is separated from the first anode layer 40" by the second anode layer 45".

In the third embodiment, a semiconductor wafer 100" shown in FIG. 10 having a first main side 101" and a second main side 102" is similar to the semiconductor wafer 100 described above. It differs from the above described semiconductor wafer 100 only in the different configuration of the first anode layers 40", the second anode layers 45" and the drift layer 50". Contrary to the drift layer 50 in the first embodiment, in the third embodiment the drift layer 50" extends up to the first main side 101" of semiconductor wafer 100". Likewise, the second anode layer 45" extends up to the first main side 101". An Insulation layer 80 provided on the first main side 101" to cover the drift layer 50" prevents the anode electrode 20 from directly contacting the drift layer 50" and from directly contacting the second anode layer 45".

In the following a power diode 91''' according to a fourth embodiment will be explained with reference to FIGS. 2 and 11 to 13. Due to many similarities between the power diode 91 according to the first embodiment and the power diode 91''' according to the fourth embodiment, not all features which are the same for the two power diodes 91 and 91''' according to the first and the fourth embodiment will be repeated in the following. The description of the power diode 91''' will focus on the differences between the first and the fourth embodiments, whereas with all other features it is referred to the description of the first embodiment above. In particular, same or similar reference signs in the drawings refer to similar elements that have the same characteristics or features.

Figure 11:
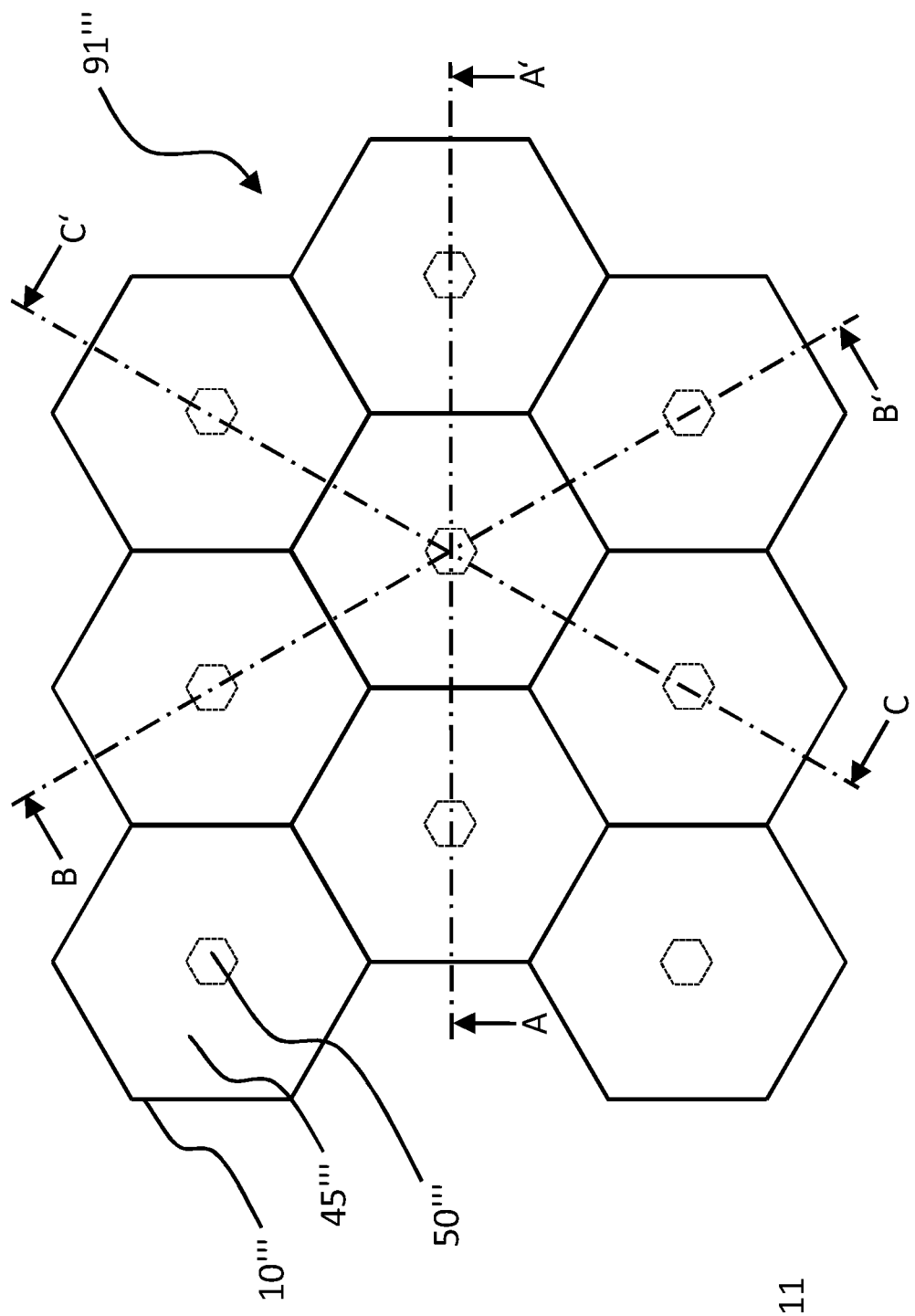
FIG. 11 shows a horizontal cross-section of nine diode cells included in the power diode according to a fourth embodiment along line I-I' in FIG. 13.

FIG. 2 shows the power diode 91''' in top view. That means the top view of power diode 91''' is the same as the top view of the power diode 91 according to the first embodiment. FIG. 11 is a first horizontal cross-section of nine diode cells 10''' included in the power diode 91''' along line I-I' in FIG. 13 (i.e. along horizontal plane K1''' in FIG. 13), FIG. 12 shows a second horizontal cross-section of nine diode cells 10''' included in the power diode 91''' along line II-II' in FIG. 13 (i.e. along horizontal plane K2''' in FIG. 13), and FIG. 13 shows a cross-section of the power diode 91 along any one of lines A-A', B-B' and C-C' in FIGS. 11 and 12, respectively (in the power semiconductor device 91''' the cross-section along line A-A' is the same as the cross-section along line B-B' and is also the same as the cross-section along line C-C' in FIGS. 11 and 12).

The power diode 91''' differs from the power diode 91 in that the second anode layer 45''' is not arranged in the lateral center of each diode cell 10''' as it is the case in the first embodiment but is arranged along the outer boundary of each diode cell 10''' in an orthogonal projection onto a horizontal plane perpendicular to the vertical direction. Accordingly, in the vertical cross-section perpendicular to the first horizontal plane K1''' as shown in FIG. 13, a portion of the drift layer 50''' laterally separates the second anode layer 45''' in each diode cell 10''' into two separate regions laterally extending from the portion of the drift layer 50''' to an edge of the diode cell 10''', respectively. In the first horizontal cross-section shown in FIG. 11, the before mentioned portion of the drift layer 50''' in each diode cell 10''' is an island-like area (where the first horizontal plane K1''' intersects the portion of the drift layer 50''') surrounded by an area where the first horizontal plane K1''' intersects the second anode layer 45'''.

Figure 12:
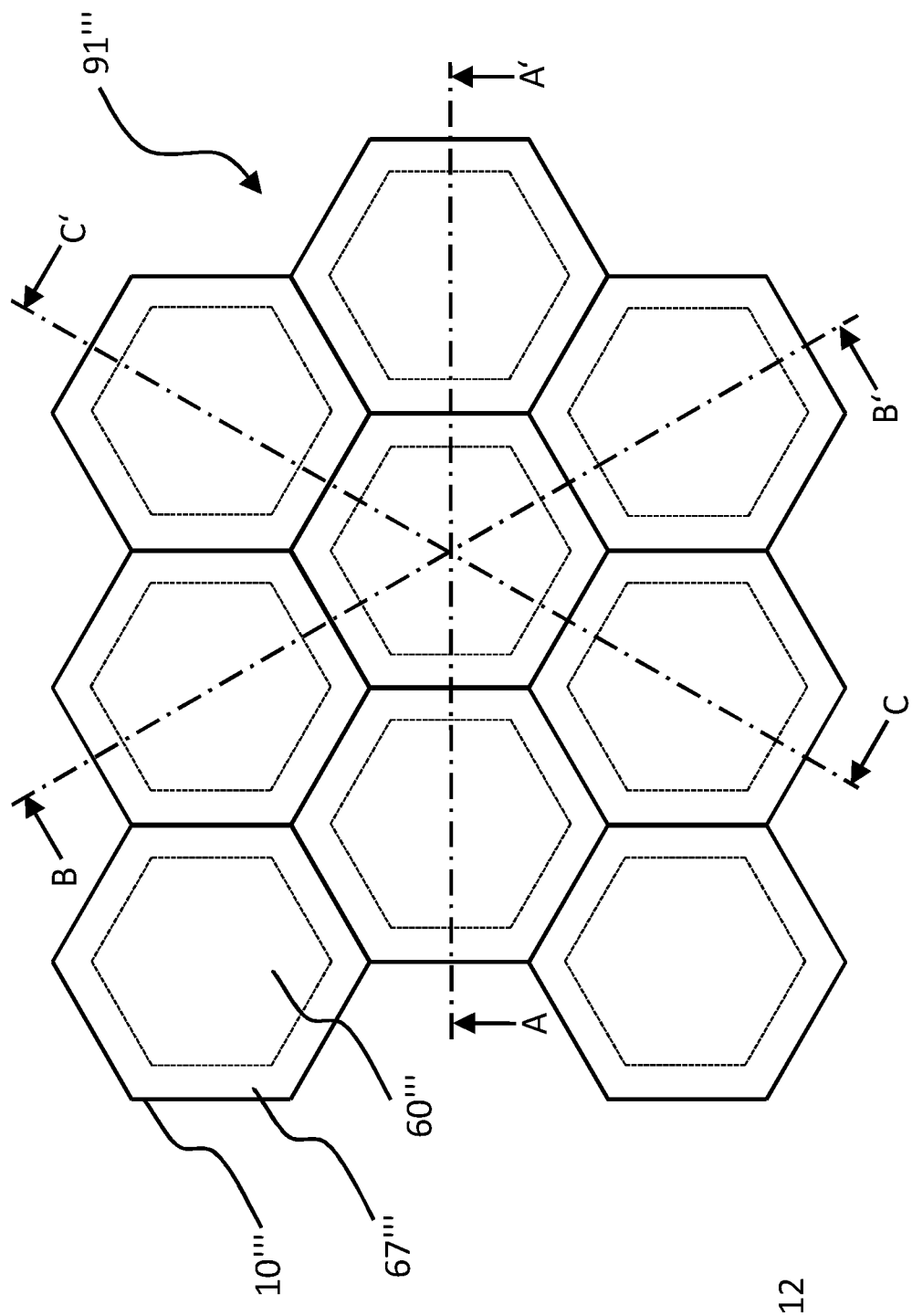
FIG. 12 shows a horizontal cross-section of nine diode cells included in the power diode according to the fourth embodiment along line II-II' in FIG. 13.

The power diode 91''' differs from the power diode 91 also in that the cathode layer 60''' is not arranged in the lateral center of each diode cell 10''' as it is the case in the first embodiment but is arranged along the outer boundary of each diode cell 10''' in the horizontal cross-section shown in FIG. 12 and in an orthogonal projection onto a horizontal plane perpendicular to the vertical direction. In the horizontal cross-section shown in FIG. 12, the cathode segmentation layer 67''' in each diode cell 10''' is an island-like area (where the second horizontal plane K2''' intersects the segmentation layer 67''') surrounded by an area where the second horizontal plane K2''' intersects the cathode layer 60'''. In the vertical cross-section perpendicular to the first horizontal plane K1''' the cathode layers 60''' of each pair of neighboring diode cells 10''' are laterally separated from each other by the cathode-side segmentation layers 67''' of the respective pair of neighboring diode cells 10'''.

Figure 13:
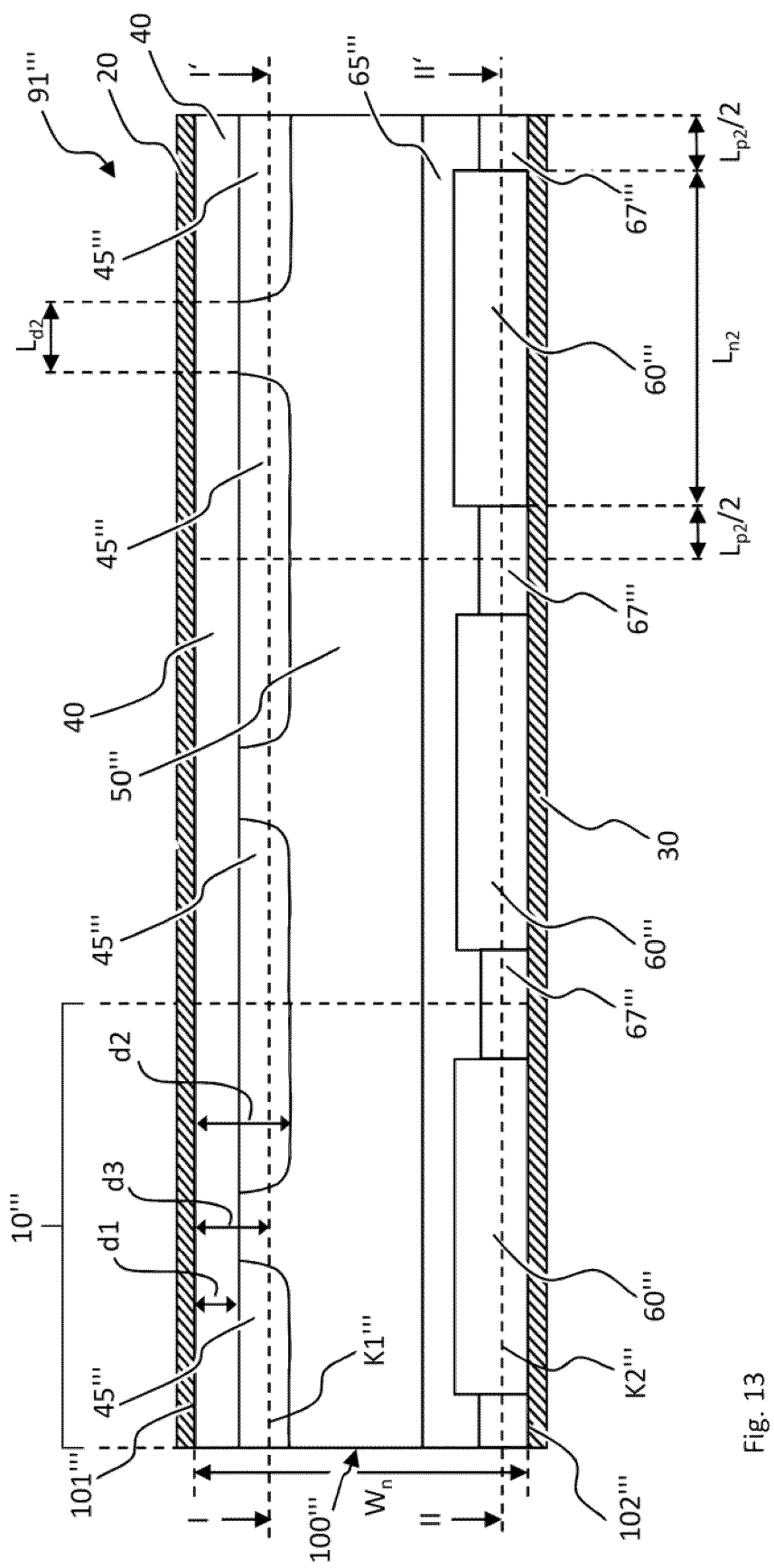
FIG. 13 shows a vertical cross-section of the power diode according to the fourth embodiment along any one of lines A-A', B-B' and C-C' in FIGS. 11 and 12, respectively.

In the vertical cross-section as shown in FIG. 13, a shortest lateral distance $L_{d2}$ between the two separate regions of the second anode layer 45''' in each diode cell 10''' of each pair of neighboring diode cells 10''' is in a range from $0.3 \cdot L_{p2}$ to $L_{p2}$, wherein $L_{p2}$ is a shortest lateral distance between the cathode layers 60''' of the pair of neighboring diode cells 10'''. This feature corresponds to the above design rule (i) in the first embodiment.

Also, in the vertical cross-section as shown in FIG. 13 a lateral width $L_{n2}$ of the cathode layer 60''' of each diode cell 10''' is in a range from $0.3 \cdot W_n$ to $W_n$, wherein $W_n$ is the vertical thickness of the diode cell 10'''. This feature corresponds to the above design rule (ii).

Finally, in the vertical cross-section as shown in FIG. 13 a shortest lateral distance $L_{p2}$ between the two cathode layers 60''' of each pair of neighboring diode cells 10''' is in a range from $0.3 \cdot W_n$ to $W_n$, wherein $W_n$ is the vertical thickness of the diode cells 10'''. This feature corresponds to the above design rule (iii).

In the fourth embodiment, a semiconductor wafer 100''' a partial vertical cross-section of which is shown in FIG. 13 has a first main side 101''' and a second main side 102''' and is similar to the semiconductor wafer 100 described above. It differs from the above described semiconductor wafer 100 only in the different shape and arrangement of the second anode layer 45''', the drift layer 50''', the buffer layer 65''', the cathode layer 60''' and of the cathode segmentation layer 67''' due to the above described structure of the diode cells 10'''.

Figure 9:
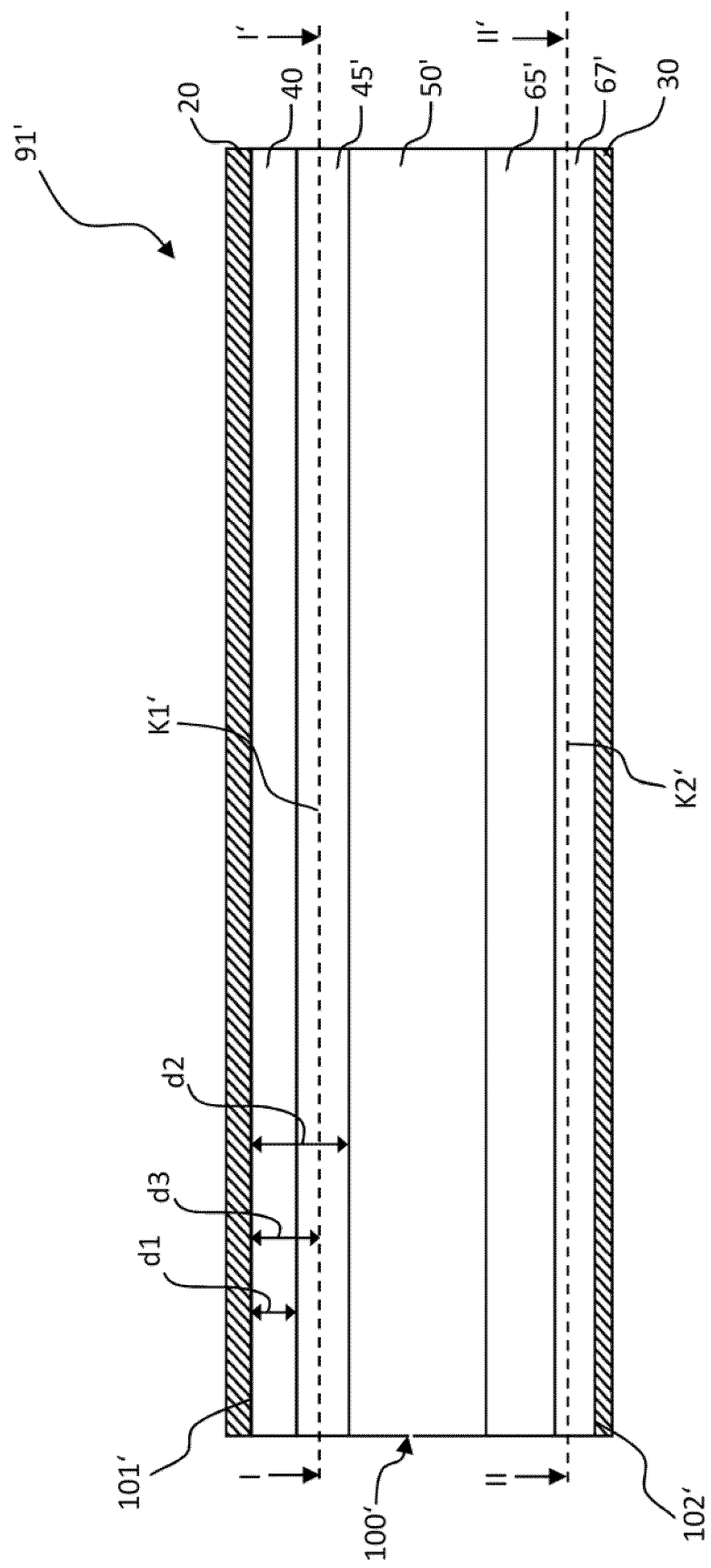
FIG. 9 shows a vertical cross-section of the power diode according to the second embodiment along line E-E' in FIGS. 7 and 8, respectively.
Figure 14:
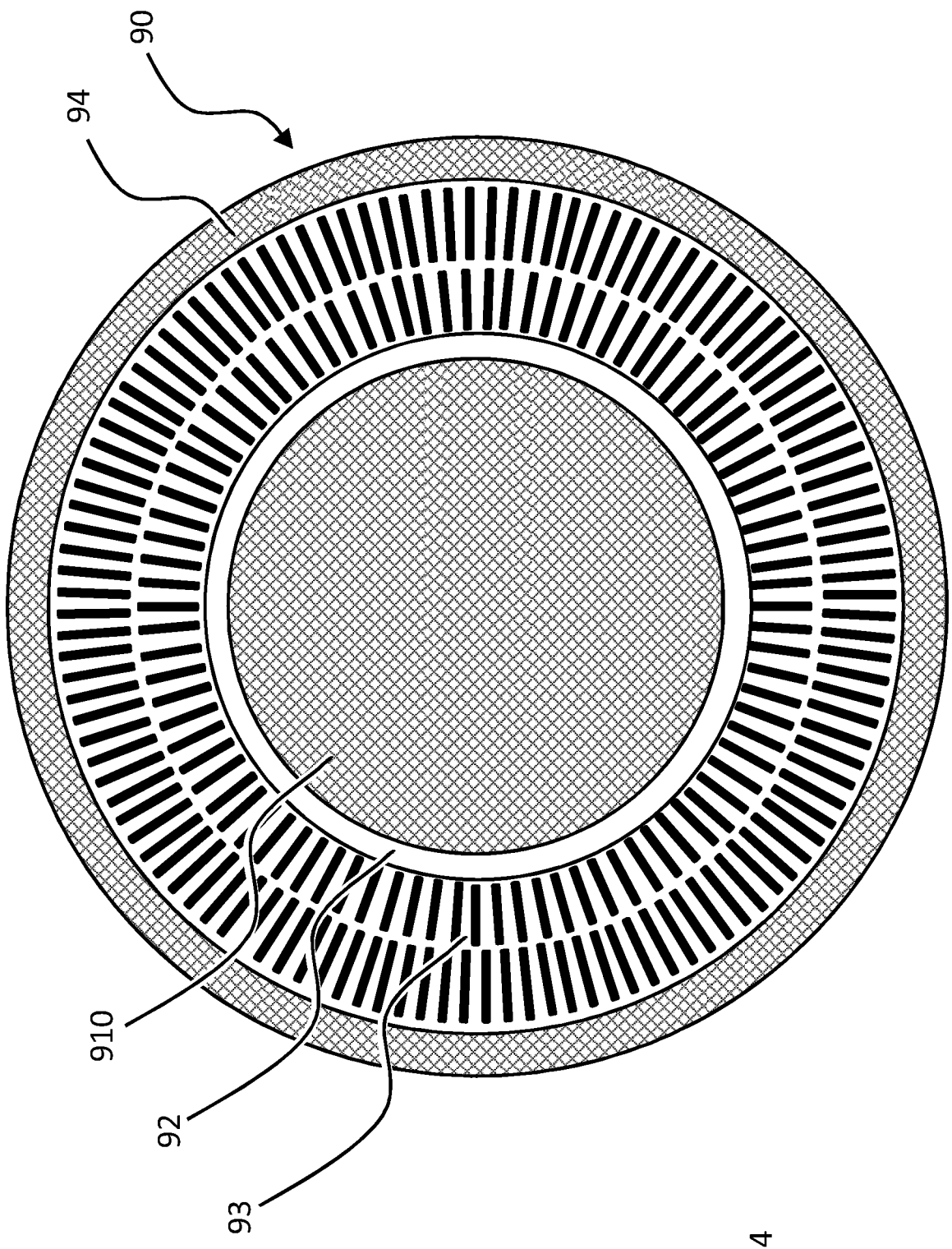
FIG. 14 shows a top view of an RC-IGCT comprising the power diode according to an embodiment of the invention.

FIG. 14 shows a top view of a reverse conducting integrated gate-commutated thyristor (RC-IGCT) 90 according to an embodiment of the invention. The RC-IGCT 90 comprises a gate-commutated thyristor (GCT) 93 and a power diode 910 (acting as a freewheeling diode) monolithically integrated in a single wafer. The GCT 93 is separated from the power diode 910 by a separation region 92 in the wafer. As illustrated in FIG. 9, the GCT 93 comprises plural GCT fingers arranged in two rings surrounding the power diode 91'''. Along the periphery of the wafer, the RC-IGCT has a gate contact 94 for control of the GCT 93 as shown in FIG. 9. The design of an RC-IGCT as such is well known to the person skilled in the art. Therefore, it is refrained from a detailed description of the structure of the GCT 93 and the separation region 92. The RC-IGCT 90 according to an embodiment of the invention differs from such well known RC-IGCT only in that the power diode 910 is a power diode according to the invention, for example structured as described above for any one of the above described power diodes 91, 91', 91'' or 91''' without the edge termination region 5. It is to be mentioned that the new diode design in the RC-IGCT 90 can be manufactured without the need of any additional mask compared to the known manufacturing method for an RC-IGCT with a conventional PiN power diode as a freewheeling diode.

It will be apparent for persons skilled in the art that modifications of the above described embodiments are possible without departing from the scope of the invention as defined by the appended claims.

In the above first to third embodiment of a power diode, the shape of the diode cells 10, 10'' and 10''' was described to be hexagonal in top view, and the shape of the diode cells 10' was described to be stripe shaped. However, the diode cells 10, 10', 10'', 10''' may have any other shape such as a square shape or a triangular shape in top view, i.e. in a horizontal projection onto a plane parallel to the first main side 101, 101', 101'', 101'''. Likewise the outer shape of the second anode layers 45, 45', 45'', 45''' in the power diode 91, 91', 91'', 91''' may have another shape than hexagonal or stripe shape, such as a square shape, a triangular shape, any other polygonal shape, or a circular shape in top view. Also, while in the first to third embodiments the outer shape of the diode cells 10, 10', 10'', 10''' is described to be the same as the outer shape of the second anode layers 45, 45', 45'', 45''' in top view (either hexagonal or stripe shaped), the outer shape of the diode cells 10, 10', 10'', 10''' in the power diode 91, 91', 91'', 91''' of the invention is not necessarily the same as the outer shape of the second anode layers 45, 45', 45'', 45''' in top view.

In the above described embodiments, the diode cells 10, 10', 10'', 10''' in one power diode 91, 91', 91'', 91''' had all the same design except the incomplete diode cells 110 directly adjacent to an edge termination region 5 or adjacent to the separation region 92 in the RC-IGCT 90. However, the power diode of the invention may employ diode cells having two or more different designs among the plural diode cells, e.g. different sized diode cells.

In the RC-IGCT the gate contact 94 is described to be located at the periphery of the device surrounding the GCT 93. However, the gate contact 94 may also be located at another location such as between two rings of thyristor fingers. Also, the GCT 93 may have any other arrangement of GCT fingers, and may have in particular any other number of rings in which the thyristor fingers are arranged.

In the above described embodiments, the power diode of the invention was described to be either a discrete device as in the first to third embodiments or to be integrated in an RC-IGCT. However, the power diode of the invention may be employed or integrated in any other power device, such as in combination with insulated-gate bipolar transistors (IGBTs) and gate turn-off thyristors (GTOs) as a freewheeling diode, snubber diode and clamp diode, for example.

In the above embodiments the power diode of the invention was described to include a buffer layer i.e. to have a punch-through (PT) configuration. However, the above embodiments may also be modified to have no buffer layer, i.e. to have a non-punch-through (NPT) configuration.

The embodiments were explained with specific conductivity types. The conductivity types of the semiconductor layers in each of the above-described embodiments may be switched, so that all layers which are described as p-type layers would be n-type layers and all layers which are described as n-type layers would be p-type layers.

It should be noted that the term "comprising" does not exclude other elements or steps and that the indefinite article "a" or "an" does not exclude the plural. Also, elements described in association with different embodiments may be combined.

The invention claimed is:

1. A power diode comprising an anode electrode layer, a cathode electrode layer and a plurality of diode cells arranged between the anode electrode layer and the cathode electrode layer, wherein each diode cell comprises:
   a first anode layer of a first conductivity type in direct contact with the anode electrode layer, extending in a horizontal direction along an entire portion of the anode electrode layer, and extending in a vertical direction from the anode electrode layer to a first depth, the vertical direction being defined as a direction from the anode electrode layer to the cathode electrode layer and the horizontal direction substantially orthogonal to the vertical direction;

a second anode layer of the first conductivity type having a lower doping concentration than the first anode layer and being separated from the entire portion of the anode electrode layer by the first anode layer, the second anode layer extending in the vertical direction from the first anode layer to a second depth that is larger than the first depth;

a drift layer of a second conductivity type forming a pn-junction with the second anode layer, wherein the second conductivity type is different from the first conductivity type and wherein a horizontal cross-section through each diode cell along a horizontal plane perpendicular to the vertical direction at a third depth comprises, in each diode cell, a first area where the horizontal plane intersects the second anode layer and a second area where the horizontal plane intersects the drift layer, the first depth being smaller than the third depth and the third depth being smaller than the second depth;

a cathode layer of second conductivity type in direct contact with the cathode electrode layer, the cathode layer having a higher doping concentration than the drift layer; and a cathode-side segmentation layer in direct contact with the cathode electrode layer, wherein a material of the cathode-side segmentation layer is an insulating material or a lightly doped semiconductor of the first conductivity type having an integrated doping content along a direction perpendicular to a main side that is below $2 \cdot 10^{13}$ cm$^{-2}$.

2. The power diode according to claim 1, wherein the material of the cathode-side segmentation layer is an insulating material.

3. The power diode according to claim 1, wherein the material of the cathode-side segmentation layer is a lightly doped semiconductor of the first conductivity type having an integrated doping content along a direction perpendicular to the main side that is below $2 \cdot 10^{13}$ cm$^{-2}$.

4. The power diode according to claim 1, wherein all diode cells of the plurality of diode cells have the same structure.

5. The power diode according to claim 1, wherein each diode cell has a hexagonal shape.

6. The power diode according to claim 1, wherein each diode cell has a stripe shape in a horizontal cross-section.

7. The power diode according to claim 1, further comprising a buffer layer of the second conductivity type, wherein:
the buffer layer has a higher doping concentration than the drift layer;
the cathode layer has a higher doping concentration than that of the buffer layer;
the buffer layer is separated from the cathode electrode layer by the cathode layer and by the cathode-side segmentation layer; and
the buffer layer is separated from the first anode layer and from the second anode layer by the drift layer.

8. A reverse conducting integrated gate-commutated thyristor device comprising:
a gate-commutated thyristor; and
the power diode according to claim 1.

9. A power diode comprising an anode electrode layer, a cathode electrode layer and a plurality of diode cells arranged between the anode electrode layer and the cathode electrode layer, wherein each diode cell comprises:
a first anode layer of a first conductivity type in direct contact with the anode electrode layer, extending in a horizontal direction along an entire portion of the anode electrode layer, and extending in a vertical direction from the anode electrode layer to a first depth, the vertical direction being defined as a direction from the anode electrode layer to the cathode electrode layer and the horizontal direction substantially orthogonal to the vertical direction;

a second anode layer of the first conductivity type having a lower doping concentration than the first anode layer and being separated from the entire portion of the anode electrode layer by the first anode layer, the second anode layer extending in the vertical direction from the first anode layer to a second depth that is larger than the first depth;

a drift layer of a second conductivity type forming a pn-junction with the second anode layer, wherein the second conductivity type is different from the first conductivity type and wherein a horizontal cross-section through each diode cell along a horizontal plane perpendicular to the vertical direction at a third depth comprises, in each diode cell, a first area where the horizontal plane intersects the second anode layer and a second area where the horizontal plane intersects the drift layer, the first depth being smaller than the third depth and the third depth being smaller than the second depth and wherein, in a vertical cross-section perpendicular to the horizontal plane, the second anode layers of each pair of neighboring diode cells are laterally separated from each other by the drift layers of that pair of neighboring diode cells;

a cathode layer of second conductivity type in direct contact with the cathode electrode layer, the cathode layer having a higher doping concentration than the drift layer; and a cathode-side segmentation layer in direct contact with the cathode electrode layer, wherein a material of the cathode-side segmentation layer is an insulating material or a lightly doped semiconductor of the first conductivity type having an integrated doping content along a direction perpendicular to a main side that is below $2 \cdot 10^{13}$ cm$^{-2}$.

10. The power diode according to claim 9, wherein the material of the cathode-side segmentation layer is an insulating material.

11. The power diode according to claim 9, wherein the material of the cathode-side segmentation layer is a lightly doped semiconductor of the first conductivity type having an integrated doping content along a direction perpendicular to the main side that is below $2 \cdot 10^{13}$ cm$^{-2}$.

12. The power diode according to claim 9, wherein, in the vertical cross-section, cathode-side segmentation layers of each pair of neighboring diode cells are laterally separated from each other by the cathode layers of the respective pair of neighboring diode cells.

13. The power diode according to claim 9, wherein, in the vertical cross-section, a shortest lateral distance $L_{d1}$ between the second anode layers of each pair of neighboring diode cells is in a range from $0.3 \cdot L_{p1}$ to $L_{p1}$, wherein $L_{p1}$ is a lateral width of the cathode-side segmentation layers of each one of the pair of neighboring diode cells in the vertical cross-section.

14. The power diode according to claim 9, wherein, in the vertical cross-section, a shortest lateral distance $L_{n1}$ between the cathode-side segmentation layers of each pair of neighboring diode cells is in a range from $0.3 \cdot W_n$ to $W_n$, wherein $W_n$ is a vertical thickness of the diode cells.

15. The power diode according to claim 9, wherein, in the vertical cross-section, a lateral width $L_{p1}$ of the cathode-side segmentation layer is in a range from $0.3 \cdot W$ to $W_n$, wherein $W_n$ is a vertical thickness of the diode cells.

16. A power diode comprising an anode electrode layer, a cathode electrode layer and a plurality of diode cells arranged between the anode electrode layer and the cathode electrode layer, wherein each diode cell comprises:
- a first anode layer of a first conductivity type in direct contact with the anode electrode layer, extending in a horizontal direction along an entire portion of the anode electrode layer, and extending in a vertical direction from the anode electrode layer to a first depth, the vertical direction being defined as a direction from the anode electrode layer to the cathode electrode layer and the horizontal direction substantially orthogonal to the vertical direction;
- a second anode layer of the first conductivity type having a lower doping concentration than the first anode layer and being separated from the entire portion of the anode electrode layer by the first anode layer, the second anode layer extending in the vertical direction from the first anode layer to a second depth that is larger than the first depth;
- a drift layer of a second conductivity type forming a pn-junction with the second anode layer, wherein the second conductivity type is different from the first conductivity type and wherein a horizontal cross-section through each diode cell along a horizontal plane perpendicular to the vertical direction at a third depth comprises, in each diode cell, a first area where the horizontal plane intersects the second anode layer and a second area where the horizontal plane intersects the drift layer, the first depth being smaller than the third depth and the third depth being smaller than the second depth and wherein, in a vertical cross-section perpendicular to the horizontal plane, a portion of the drift layer laterally separates the second anode layer in each diode cell into two separate regions laterally extending from the portion of the drift layer to an edge of the diode cell;
- a cathode layer of second conductivity type in direct contact with the cathode electrode layer, the cathode layer having a higher doping concentration than the drift layer; and
- a cathode-side segmentation layer in direct contact with the cathode electrode layer, wherein a material of the cathode-side segmentation layer is an insulating material or a lightly doped semiconductor of the first conductivity type having an integrated doping content along a direction perpendicular to a main side that is below $2 \cdot 10^{13}$ cm$^{-2}$.

17. The power diode according to claim 16, wherein the material of the cathode-side segmentation layer is an insulating material.

18. The power diode according to claim 16, wherein the material of the cathode-side segmentation layer is a lightly doped semiconductor of the first conductivity type having an integrated doping content along a direction perpendicular to the main side that is below $2 \cdot 10^{13}$ cm$^{-2}$.

19. The power diode according to claim 16, wherein, in the vertical cross-section, the cathode layers of each pair of neighboring diode cells are laterally separated from each other by the cathode-side segmentation layers of that pair of neighboring diode cells.

20. The power diode according to claim 16, wherein, in the vertical cross-section, a shortest lateral distance $L_{d2}$ between the two separate regions of the second anode layer in each diode cell of each pair of neighboring diode cells is in a range from $0.3 \cdot L_{p2}$ to $L_{p2}$, wherein $L_{p2}$ is a shortest lateral distance between the cathode layers of the pair of neighboring diode cells in the vertical cross-section.

21. The power diode according to claim 16, wherein, in the vertical cross-section, a lateral width $L_{n2}$ of the cathode layer of each diode cell is in a range from $0.3 \cdot W_n$ to $W_n$, wherein $W_n$ is a vertical thickness of the diode cell.

22. The power diode according to claim 16, wherein, in the vertical cross-section, a shortest lateral distance $L_{p2}$ between the cathode layers of each pair of neighboring diode cells is in a range from $0.3 \cdot W_n$ to $W_n$, wherein $W_n$ is a vertical thickness of the diode cells.

23. A method of forming the power diode of claim 1, the method comprising:
- forming the first anode layer;
- forming the second anode layer;
- forming the drift layer;
- forming the cathode layer; and
- forming the cathode-side segmentation layer.

* * * * *

UNITED STATES PATENT AND TRADEMARK OFFICE
CERTIFICATE OF CORRECTION

PATENT NO. : 11,967,638 B2
APPLICATION NO. : 17/600812
DATED : April 23, 2024
INVENTOR(S) : Wikstroem et al.

It is certified that error appears in the above-identified patent and that said Letters Patent is hereby corrected as shown below:

In the Claims

In Column 19, in Claim 15, Line 3, delete "$0.3 \cdot W$" and insert -- $0.3 \cdot W_n$ --.

Signed and Sealed this
Eleventh Day of June, 2024

Katherine Kelly Vidal
*Director of the United States Patent and Trademark Office*